United States Patent
Pan et al.

(10) Patent No.: US 8,598,449 B2
(45) Date of Patent: Dec. 3, 2013

(54) CONJUGATED POLYMERS AND THEIR USE IN OPTOELECTRONIC DEVICES

(75) Inventors: Hualong Pan, Skokie, IL (US); He Yan, Skokie, IL (US); Yan Yao, Skokie, IL (US); Shaofeng Lu, Skokie, IL (US); Zhengguo Zhu, Chelmsford, MA (US); Antonio Facchetti, Chicago, IL (US)

(73) Assignee: Polyera Corporation, Skokie, IL (US)

( * ) Notice: Subject to any disclaimer, the term of this patent is extended or adjusted under 35 U.S.C. 154(b) by 42 days.

(21) Appl. No.: 13/301,680

(22) Filed: Nov. 21, 2011

(65) Prior Publication Data

US 2012/0187385 A1    Jul. 26, 2012

Related U.S. Application Data

(63) Continuation of application No. PCT/US2010/035878, filed on May 21, 2010.

(60) Provisional application No. 61/180,256, filed on May 21, 2009, provisional application No. 61/323,152, filed on Apr. 12, 2010.

(51) Int. Cl.
*H01L 31/00* (2006.01)

(52) U.S. Cl.
USPC ...... 136/263; 526/256; 257/40; 257/E51.005; 257/E51.018

(58) Field of Classification Search
USPC ............. 136/263; 526/256; 257/40, E51.005, 257/E51.018
See application file for complete search history.

(56) References Cited

U.S. PATENT DOCUMENTS

2009/0302311 A1*  12/2009  Turbiez et al. ................. 257/40

* cited by examiner

*Primary Examiner* — Shane Fang
(74) *Attorney, Agent, or Firm* — Karen K. Chan

(57) ABSTRACT

Disclosed are certain oligomeric and polymeric compounds and their use as organic semiconductors in organic and hybrid optical, optoelectronic, and/or electronic devices such as photovoltaic cells, light emitting diodes, light emitting transistors, and field effect transistors. The disclosed compounds can provide high power conversion efficiency, fill factor, open circuit voltage, field-effect mobility, on/off current ratios, and/or air stability when used in photovoltaic cells or transistors. The disclosed compounds can have good solubility in common solvents enabling device fabrication via solution processes.

12 Claims, 1 Drawing Sheet

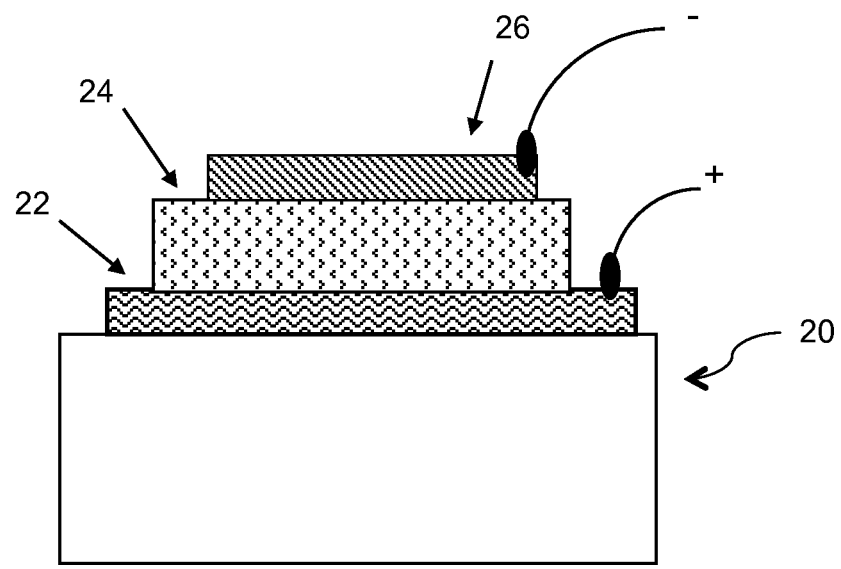

CONJUGATED POLYMERS AND THEIR USE IN OPTOELECTRONIC DEVICES

CROSS REFERENCE TO RELATED APPLICATIONS

This application is a continuation of International Application No. PCT/US10/35878, which claims priority to and the benefit of U.S. Provisional Patent Application Ser. No. 61/180,256, filed on May 21, 2009, and U.S. Provisional Patent Application Ser. No. 61/323,152, filed on Apr. 12, 2010, the disclosure of each of which is incorporated by reference herein in its entirety.

BACKGROUND

A new generation of optoelectronic devices such as organic photovoltaics (OPVs) and organic light-emitting transistors (OLETs) are fabricated using organic semiconductors as their active components. To be commercially relevant, these organic semiconductor-based devices should be processable in a cost-effective manner.

Bulk heterojunction (BHJ) solar cells commonly are considered the most promising OPV structures because they can be fabricated using roll-to-roll and large-scale production. BHJ solar cells include a photoactive layer disposed between an anode and a cathode, where the photoactive layer is composed of a blend film including a "donor" material and an "acceptor" material. FIG. 1 illustrates a representative BHJ organic solar cell structure.

State-of-the-art BHJ solar cells use fullerene-based compounds as the acceptor material. Typical fullerenes include C60 or C70 "bucky ball" compounds functionalized with solubilizing side chains, such as C60 [6,6]-phenyl-C61-butyric acid methyl ester ($C_{60}$PCBM) or $C_{70}$PCBM. The most common donor material used in BHJ solar cells is poly(3-hexylthiophene) (P3HT). However, P3HT/PCBM-based solar cells have several fundamental limitations. For example, the band-gap of P3HT is ~2.0 eV, and it can absorb only a small portion (30%) of the solar spectrum.

Accordingly, the art desires new organic semiconductor materials for use in optoelectronic devices such as organic photovoltaics.

SUMMARY

In light of the foregoing, the present teachings provide certain oligomeric and polymeric compounds that can be used as organic semiconductors. Also provided are associated devices and related methods for the preparation and use of these compounds.

The present compounds can exhibit properties such as excellent charge transport characteristics in ambient conditions, optimized optical absorption, chemical stability, low-temperature processability, large solubility in common solvents, and processing versatility (e.g., via various solution processes). As a result, optoelectronic devices such as solar cells that incorporate one or more of the present compounds as a photoactive layer can exhibit high performance in ambient conditions, for example, demonstrating one or more of low band-gap, high fill factor, high open circuit voltage, and high power conversion efficiency, and preferably all of these criteria. Similarly, other organic semiconductor-based devices such as OLETs can be fabricated efficiently using the organic semiconductor materials described herein.

The present teachings also provide methods of preparing such compounds and semiconductor materials, as well as various compositions, composites, and devices that incorporate the compounds and semiconductor materials disclosed herein.

The foregoing as well as other features and advantages of the present teachings will be more fully understood from the following figures, description, examples, and claims.

BRIEF DESCRIPTION OF DRAWINGS

It should be understood that the drawings described below are for illustration purpose only. The drawings are not necessarily to scale, with emphasis generally being placed upon illustrating the principles of the present teachings. The drawings are not intended to limit the scope of the present teachings in any way.

FIG. 1 illustrates a representative bulk-heterojunction (BHJ) organic photovoltaic device (also known as a solar cell) structure, which can incorporate one or more compounds of the present teachings as its photoactive layer (as donor and/or acceptor materials).

DETAILED DESCRIPTION

The present teachings provide organic semiconductor materials that are prepared from various π-conjugated oligomeric and polymeric compounds having typically an electron-rich repeat unit and an electron-poor repeat unit. Compounds of the present teachings can exhibit semiconductor behavior such as high carrier mobility and/or good current modulation characteristics in a field-effect device, optimized light absorption/charge separation in a photovoltaic device, and/or charge transport/recombination/light emission in a light-emitting device. In addition, the present compounds can possess certain processing advantages such as solution-processability and/or good stability (e.g., air stability) in ambient conditions. The compounds of the present teachings can be used to prepare either p-type (donor or hole-transporting), n-type (acceptor or electron-transporting), or ambipolar semiconductor materials, which in turn can be used to fabricate various organic or hybrid optoelectronic articles, structures and devices, including organic photovoltaic devices and organic light-emitting transistors.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, an "oligomeric compound" (or "oligomer") or a "polymeric compound" (or "polymer") refers to a molecule including a plurality of one or more repeat units connected by covalent chemical bonds. An oligomeric or polymeric compound can be represented by the general formula:

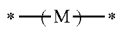

wherein M is the repeat unit or monomer. The degree of polymerization can range from 2 to greater than 10,000. For example, for oligomeric compounds, the degree of polymerization can range from 2 to 9; and for polymeric compounds, the degree of polymerization can range from 10 to about 10,000. The oligomeric or polymeric compound can have only one type of repeat unit as well as two or more types of different repeat units. When a polymeric compound has only one type of repeat unit, it can be referred to as a homopolymer. When a polymeric compound has two or more types of different repeat units, the term "copolymer" or "copolymeric compound" can be used instead. The oligomeric or polymeric compound can be linear or branched. Branched polymers can include dendritic polymers, such as dendronized polymers, hyperbranched polymers, brush polymers (also called bottlebrushes), and the like. Unless specified otherwise, the assembly of the repeat units in the copolymer can be head-to-tail, head-to-head, or tail-to-tail. In addition, unless specified otherwise, the copolymer can be a random copolymer, an alternating copolymer, or a block copolymer. For example, the general formula:

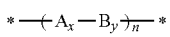

can be used to represent a co-oligomer or copolymer of A and B having x mole fraction of A and y mole fraction of B in the copolymer, where the manner in which comonomers A and B is repeated can be alternating, random, regiorandom, regioregular, or in blocks. The degree of polymerization (n) can range from 2 to greater than 10,000.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and optionally can be substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which optionally can be substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which optionally can be substituted as described herein.

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neo-pentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula $—C_sH_{2s+1-t}X^0{}_t$, where $X^0$, at each occurrence, is F, Cl, Br or I, s is an integer in the range of 1 to 40, and t is an integer in the range of 1 to 81, provided that t is less than or equal to 2s+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S-alkyl group (which, in some cases, can be expressed as —S(O)$_w$-alkyl, wherein w is 0). Examples of alkylthio groups include, but are not limited to, methylthio, ethylthio, propylthio (e.g., n-propylthio and isopropylthio), t-butylthio, pentylthio, hexylthio groups, and the like. The alkyl group in the —S-alkyl group can be substituted as described herein.

As used herein, "arylalkyl" refers to an -alkyl-aryl group, where the arylalkyl group is covalently linked to the defined chemical structure via the alkyl group. An arylalkyl group is within the definition of a —Y—$C_{6-14}$ aryl group, where Y is as defined herein. An example of an arylalkyl group is a benzyl group (—$CH_2$—$C_6H_5$). An arylalkyl group optionally can be substituted, i.e., the aryl group and/or the alkyl group, can be substituted as disclosed herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or spiroring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., $—C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

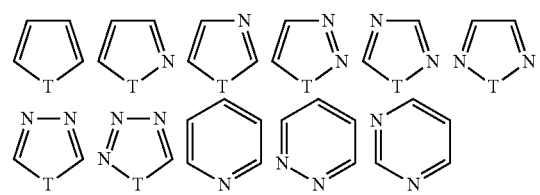

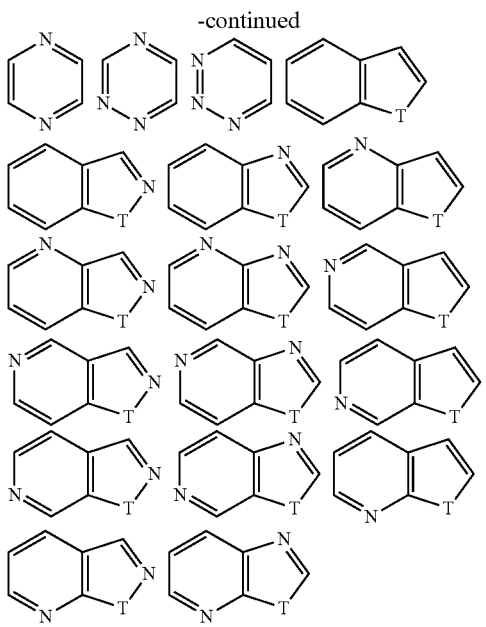

where T is O, S, NH, N-alkyl, N-aryl, N-(arylalkyl) (e.g., N-benzyl), SiH$_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Compounds of the present teachings can include a "divalent group" defined herein as a linking group capable of forming a covalent bond with two other moieties. For example, compounds of the present teachings can include a divalent C$_{1-20}$ alkyl group (e.g., a methylene group), a divalent C$_{2-20}$ alkenyl group (e.g., a vinylyl group), a divalent C$_{2-20}$ alkynyl group (e.g., an ethynylyl group). a divalent C$_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

The electron-donating or electron-withdrawing properties of several hundred of the most common substituents, reflecting all common classes of substituents have been determined, quantified, and published. The most common quantification of electron-donating and electron-withdrawing properties is in terms of Hammett σ values. Hydrogen has a Hammett σ value of zero, while other substituents have Hammett σ values that increase positively or negatively in direct relation to their electron-withdrawing or electron-donating characteristics. Substituents with negative Hammett σ values are considered electron-donating, while those with positive Hammett σ values are considered electron-withdrawing. See Lange's Handbook of Chemistry, 12th ed., McGraw Hill, 1979, Table 3-12, pp. 3-134 to 3-138, which lists Hammett σ values for a large number of commonly encountered substituents and is incorporated by reference herein.

It should be understood that the term "electron-accepting group" can be used synonymously herein with "electron acceptor" and "electron-withdrawing group". In particular, an "electron-withdrawing group" ("EWG") or an "electron-accepting group" or an "electron-acceptor" refers to a functional group that draws electrons to itself more than a hydrogen atom would if it occupied the same position in a molecule. Examples of electron-withdrawing groups include, but are not limited to, halogen or halo (e.g., F, Cl, Br, I), —NO$_2$, —CN, —NC, —S(R$^o$)$_2^+$, —N(R$^o$)$_3^+$, —SO$_3$H, —SO$_2$R$^o$, —SO$_3$R$^o$, —SO$_2$NHR$^o$, —SO$_2$N(R$^o$)$_2$, —COOH, —COR$^o$, —COOR$^o$, —CONHR$^o$, —CON(R$^o$)$_2$, C$_{1-40}$ haloalkyl groups, C$_{6-14}$ aryl groups, and 5-14 membered electron-poor heteroaryl groups; where R$^o$ is a C$_{1-20}$ alkyl group, a C$_{2-20}$ alkenyl group, a C$_{2-20}$ alkynyl group, a C$_{1-20}$ haloalkyl group, a C$_{1-20}$ alkoxy group, a C$_{6-14}$ aryl group, a C$_{3-14}$ cycloalkyl group, a 3-14 membered cycloheteroalkyl group, and a 5-14 membered heteroaryl group, each of which optionally can be substituted as described herein. For example, each of the C$_{1-20}$ alkyl group, the C$_{2-20}$ alkenyl group, the C$_{2-20}$ alkynyl group, the C$_{1-20}$ haloalkyl group, the C$_{1-20}$ alkoxy group, the C$_{6-14}$ aryl group, the C$_{3-14}$ cycloalkyl group, the 3-14 membered cycloheteroalkyl group, and the 5-14 membered heteroaryl group optionally can be substituted with 1-5 small electron-withdrawing groups such as F, Cl, Br, —NO$_2$, —CN, —NC, —S(R$^o$)$_2^+$, —N(R$^o$)$_3^+$, —SO$_3$H, —SO$_2$R$^o$, —SO$_3$R$^o$, —SO$_2$NHR$^o$, —SO$_2$N(R$^o$)$_2$, —COOH, —COR$^o$, —COOR$^o$, —CONHR$^o$, and —CON(R$^o$)$_2$.

It should be understood that the term "electron-donating group" can be used synonymously herein with "electron donor". In particular, an "electron-donating group" or an "electron-donor" refers to a functional group that donates electrons to a neighboring atom more than a hydrogen atom would if it occupied the same position in a molecule. Examples of electron-donating groups include —OH, —OR$^o$, —NH$_2$, —NHR$^o$, —N(R$^o$)$_2$, and 5-14 membered electron-rich heteroaryl groups, where R$^o$ is a C$_{1-20}$ alkyl group, a C$_{2-20}$ alkenyl group, a C$_{2-20}$ alkynyl group, a C$_{6-14}$ aryl group, or a C$_{3-14}$ cycloalkyl group.

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 6-membered heteroaryl groups having one or more heteroatoms such as pyridine, pyrazine, pyridazine, and pyrimidine; as well as their benzofused counterparts such as quinoline, isoquinoline, quinoxaline, cinnoline, phthalazine, naphthyridine, quinazoline, phenanthridine, acridine, and purine. Mixed heteroaromatic rings can belong to either class depending on the type, number, and position of the one or more heteroatom(s) in the ring. See Katritzky, A. R and Lagowski, J. M., *Heterocyclic Chemistry* (John Wiley & Sons, New York, 1960).

At various places in the present specification, substituents are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Compounds described herein can contain an asymmetric atom (also referred as a chiral center) and some of the compounds can contain two or more asymmetric atoms or centers, which can thus give rise to optical isomers (enantiomers) and diastereomers (geometric isomers). The present teachings include such optical isomers and diastereomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of compounds containing alkenyl moieties (e.g., alkenes, azo, and imines). It also should be understood that the compounds of the present teachings encompass all possible regioisomers in pure form and mixtures thereof. In some embodiments, the preparation of the present compounds can include separating such isomers using standard separation procedures known to those skilled in the art, for example, by using one or more of column chromatography, thin-layer chromatography, simulated moving-bed chromatography, and high-performance liquid chromatography. However, mixtures of regioisomers can be used similarly to the uses of each individual regioisomer of the present teachings as described herein and/or known by a skilled artisan.

It is specifically contemplated that the depiction of one regioisomer includes any other regioisomers and any regioisomeric mixtures unless specifically stated otherwise.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halogen (e.g., Cl, Br, I), azide ($N_3$), thiocyanate (SCN), nitro ($NO_2$), cyanate (CN), water ($H_2O$), ammonia ($NH_3$), and sulfonate groups (e.g., $OSO_2$—R, wherein R can be a $C_{1-10}$ alkyl group or a $C_{6-14}$ aryl group each optionally substituted with 1-4 groups independently selected from a $C_{1-10}$ alkyl group and an electron-withdrawing group) such as tosylate (toluenesulfonate, OTs), mesylate (methanesulfonate, OMs), brosylate (p-bromobenzenesulfonate, OBs), nosylate (4-nitrobenzenesulfonate, ONs), and triflate (trifluoromethanesulfonate, OTf).

As used herein, a "p-type semiconductor material" or a "donor" material refers to a semiconductor material having holes as the majority current or charge carriers. In some embodiments, when a p-type semiconductor material is deposited on a substrate, it can provide a hole mobility in excess of about $10^{-5}$ cm$^2$/Vs. In the case of field-effect devices, a p-type semiconductor can also exhibit a current on/off ratio of greater than about 10.

As used herein, an "n-type semiconductor material" or an "acceptor" material refers to a semiconductor material having electrons as the majority current or charge carriers. In some embodiments, when an n-type semiconductor material is deposited on a substrate, it can provide an electron mobility in excess of about $10^{-5}$ cm$^2$/Vs. In the case of field-effect devices, an n-type semiconductor can also exhibit a current on/off ratio of greater than about 10.

As used herein, "mobility" refers to a measure of the velocity with which charge carriers, for example, holes (or units of positive charge) in the case of a p-type semiconductor material and electrons in the case of an n-type semiconductor material, move through the material under the influence of an electric field. This parameter, which depends on the device architecture, can be measured using a field-effect device or space-charge limited current measurements.

As used herein, fill factor (FF) is the ratio (given as a percentage) of the actual maximum obtainable power, ($P_m$ or $V_{mp}*J_{mp}$), to the theoretical (not actually obtainable) power, ($J_{sc} \times V_{oc}$). Accordingly, FF can be determined using the equation:

$$FF=(V_{mp}*J_{mp})/(J_{sc}*V_{oc})$$

where $J_{mp}$ and $V_{mp}$ represent the current density and voltage at the maximum power point ($P_m$), respectively, this point being obtained by varying the resistance in the circuit until J*V is at its greatest value; and $J_{sc}$ and $V_{oc}$ represent the short circuit current and the open circuit voltage, respectively. Fill factor is a key parameter in evaluating the performance of solar cells. Commercial solar cells typically have a fill factor of about 0.60% or greater.

As used herein, the open-circuit voltage ($V_{oc}$) is the difference in the electrical potentials between the anode and the cathode of a device when there is no external load connected.

As used herein, the power conversion efficiency (PCE) of a solar cell is the percentage of power converted from absorbed light to electrical energy. The PCE of a solar cell can be calculated by dividing the maximum power point ($P_m$) by the input light irradiance (E, in W/m$^2$) under standard test conditions (STC) and the surface area of the solar cell ($A_c$ in m$^2$). STC typically refers to a temperature of 25° C. and an irradiance of 1000 W/m$^2$ with an air mass 1.5 (AM 1.5) spectrum.

As used herein, a component (such as a thin film layer) can be considered "photoactive" if it contains one or more compounds that can absorb photons to produce excitons for the generation of a photocurrent.

As used herein, a compound can be considered "ambient stable" or "stable at ambient conditions" when a transistor incorporating the compound as its semiconducting material exhibits a carrier mobility that is maintained at about its initial measurement when the compound is exposed to ambient conditions, for example, air, ambient temperature, and humidity, over a period of time. For example, a compound can be described as ambient stable if a transistor incorporating the compound shows a carrier mobility that does not vary more than 20% or more than 10% from its initial value after exposure to ambient conditions, including, air, humidity and temperature, over a 3 day, 5 day, or 10 day period.

As used herein, "solution-processable" refers to compounds (e.g., polymers), materials, or compositions that can be used in various solution-phase processes including spin-coating, printing (e.g., inkjet printing, screen printing, pad printing, offset printing, gravure printing, flexographic printing, lithographic printing, mass-printing and the like), spray coating, electrospray coating, drop casting, dip coating, and blade coating.

Throughout the specification, structures may or may not be presented with chemical names. Where any question arises as to nomenclature, the structure prevails.

The present teachings relate to certain oligomeric and polymeric compounds that can be used as organic semiconductors. The present compounds can have good solubility in various common solvents and good stability in air. When incorporated into optical or optoelectronic devices including, but not limited to, photovoltaic or solar cells, light emitting diodes, and light emitting transistors, the present compounds can confer various desirable performance properties. For example, when the present compounds are used in a photoactive layer of a solar cell (e.g., bulk heterojunction devices), the solar cell can exhibit a power conversion efficiency of about 2.0% or greater, a fill factor of about 40% or greater, and/or an open circuit voltage of about 0.6 V or greater. In some embodiments, the present compounds also can be processed into very efficient solar cells without a thermally annealing step, thus providing time- and cost-saving benefits and allowing a larger variety of materials to be used in various components of the solar cell.

More specifically, the present teachings provide various conjugated oligomeric and polymeric compounds, where each compound includes a repeat unit that can be represented by the formula:

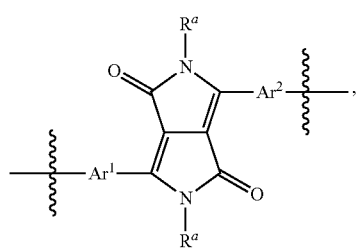

wherein:
$Ar^1$ and $Ar^2$ independent are an optionally substituted bicyclic heteroaryl moiety comprising at least one optionally substituted thienyl group; and
$R^a$ can be H, a $C_{1-40}$ alkyl group, a $C_{2-40}$ alkenyl group, or a $C_{2-40}$ alkynyl group, where the $C_{1-40}$ alkyl group, the $C_{2-40}$ alkenyl group, or the $C_{2-40}$ alkynyl group can be optionally substituted (e.g., with one or more halogens, silyl groups, and/or cyclic moieties) and/or include one or more —CH$_2$— groups that are replaced by a heteroatom (e.g., O or S) or a functional group (e.g., C(O) or NH).

For example, $Ar^1$ and $Ar^2$ can be represented by the formula:

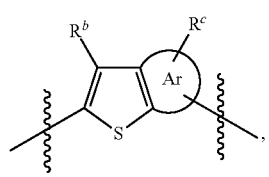

wherein:
Ar is a monocyclic aryl or heteroaryl group; and
each of $R^b$ and $R^c$ independently is H or -L-R, wherein:
L, at each occurrence, independently can be selected from O, S, Se, NR', and a covalent bond;
R, at each occurrence, independently can be a $C_{1-40}$ alkyl group; and
R' can be selected from H and a $C_{1-40}$ alkyl group.

To further illustrate, $Ar^1$ and $Ar^2$ can be selected from:

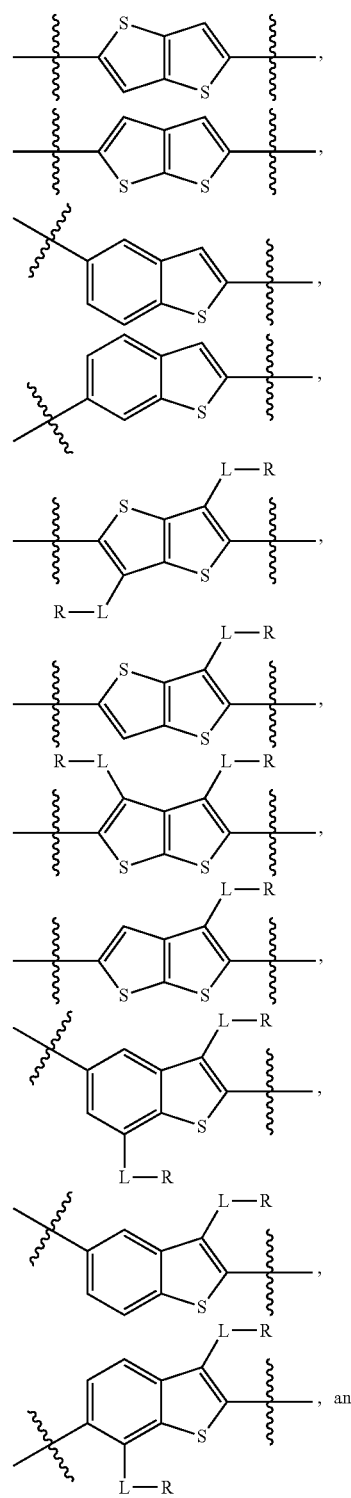

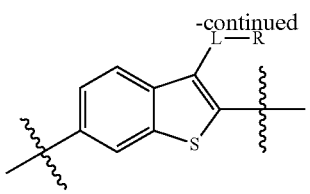

where L and R are as defined herein.

In some embodiments, each of $Ar^1$ and $Ar^2$ can be connected to the diketo-pyrrolopyrrole moiety:

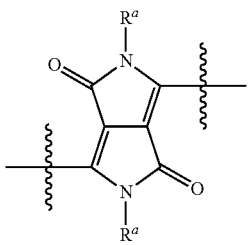

via the optionally substituted thienyl group. Accordingly, certain compounds of the present teachings can have a repeat unit represented by the formula:

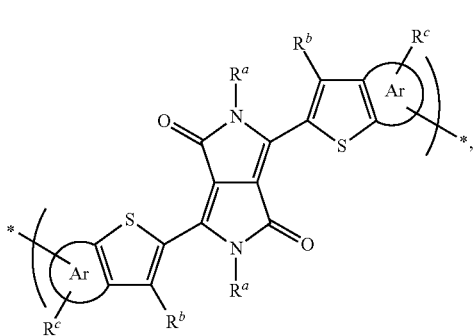

where Ar, $R^a$, $R^b$, and $R^c$ are as defined herein.

For example, $R^a$ can be selected from H, a $C_{1-40}$ alkyl group, a $C_{2-40}$ alkenyl group, a $C_{2-40}$ alkynyl group, a $C_{1-40}$ haloalkyl group, and 1-4 cyclic moieties, wherein:

each of the $C_{1-40}$ alkyl group, the $C_{2-40}$ alkenyl group, the $C_{2-40}$ alkynyl group, and the $C_{1-40}$ haloalkyl group optionally can be substituted with 1-10 substituents independently selected from a halogen, —CN, $NO_2$, OH, —$NH_2$, —$NH(C_{1-20}$ alkyl), —$N(C_{1-20}$ alkyl)$_2$, —$S(O)_2OH$, —CHO, —C(O)—$C_{1-20}$ alkyl, —C(O)OH, —C(O)—$OC_{1-20}$ alkyl, —C(O)$NH_2$, —C(O)NH—$C_{1-20}$ alkyl, —C(O)N($C_{1-20}$ alkyl)$_2$, —$OC_{1-20}$ alkyl, —$SiH_3$, —$SiH(C_{1-20}$ alkyl)$_2$, —$SiH_2(C_{1-20}$ alkyl), and —$Si(C_{1-20}$ alkyl)$_3$;

one or more —$CH_2$— groups in the $C_{1-40}$ alkyl group, the $C_{2-40}$ alkenyl group, the $C_{2-40}$ alkynyl group, and the $C_{1-40}$ haloalkyl group optionally can be replaced by a functional group such as —O—, —S—, —NH—, or —$N(C_{1-6}$ alkyl)-; and each of the 1-4 cyclic moieties can be the same or different, can be covalently bonded to each other or the imide nitrogen via an optional linker, and can be optionally substituted with 1-5 substituents independently selected from a halogen, —CN, oxo, $NO_2$, OH, =$C(CN)_2$, —$NH_2$, —$NH(C_{1-40}$ alkyl), —$N(C_{1-40}$ alkyl)$_2$, —$S(O)_2$OH, —CHO, —C(O)OH, —C(O)—$C_{1-40}$ alkyl, —C(O)—$OC_{1-40}$ alkyl, —C(O)$NH_2$, —C(O)NH—$C_{1-40}$ alkyl, —C(O)N($C_{1-40}$ alkyl)$_2$, —$SiH_3$, —SiH($C_{1-40}$ alkyl)$_2$, —$SiH_2(C_{1-40}$ alkyl), —Si($C_{1-40}$ alkyl)$_3$, —O—$C_{1-40}$ alkyl, a $C_{1-40}$ alkyl group, a $C_{2-40}$ alkenyl group, a $C_{2-40}$ alkynyl group, and a $C_{1-40}$ haloalkyl group; wherein each of the $C_{1-40}$ alkyl group, the $C_{2-40}$ alkenyl group, the $C_{2-40}$ alkynyl group, and the $C_{1-40}$ haloalkyl group optionally can be substituted with 1-5 substituents independently selected from a halogen, —CN, $NO_2$, OH, —$NH_2$, —$NH(C_{1-16}$ alkyl), —$N(C_{1-6}$ alkyl)$_2$, —$S(O)_2OH$, —CHO, —C(O)—$C_{1-6}$alkyl, —C(O)OH, —C(O)—$OC_{1-6}$ alkyl, —C(O)$NH_2$, —C(O)NH—$C_{1-6}$alkyl, —C(O)N($C_{1-6}$alkyl)$_2$, —$OC_{1-6}$ alkyl, —$SiH_3$, —SiH($C_{1-6}$alkyl)$_2$, —$SiH_2(C_{1-6}$ alkyl), and —Si($C_{1-6}$alkyl)$_3$.

In certain embodiments, $R^a$ can be selected from H, a $C_{1-40}$ alkyl group, a $C_{2-40}$ alkenyl group, a $C_{2-40}$ alkynyl group, and a $C_{1-40}$ haloalkyl group, wherein:

each of the $C_{1-40}$ alkyl group, the $C_{2-40}$ alkenyl group, the $C_{2-40}$ alkynyl group, the $C_{1-40}$ haloalkyl group, optionally can be substituted with 1-10 substituents independently selected from a halogen, —CN, $NO_2$, OH, —$NH_2$, —$NH(C_{1-20}$ alkyl), —$N(C_{1-20}$ alkyl)$_2$, —$S(O)_2$OH, —CHO, —C(O)—$C_{1-20}$ alkyl, —C(O)OH, —C(O)—$OC_{1-20}$ alkyl, —C(O)$NH_2$, —C(O)NH—$C_{1-20}$ alkyl, —C(O)N($C_{1-20}$ alkyl)$_2$, —$OC_{1-20}$ alkyl, —$SiH_3$, —SiH($C_{1-20}$ alkyl)$_2$, —$SiH_2(C_{1-20}$ alkyl), and —Si($C_{1-20}$ alkyl)$_3$; and one or more non-adjacent —$CH_2$— groups in the $C_{1-40}$ alkyl group, the $C_{2-40}$ alkenyl group, the $C_{2-40}$ alkynyl group, and the $C_{1-40}$ haloalkyl group can be replaced by a group independently selected from —O—, —S—, —NH—, —N($C_{1-20}$ alkyl)-, —C(O)—, —C(O)O—, and —Si($C_{1-20}$ alkyl)$_2$-.

To further illustrate, in various embodiments, $R^a$ can be selected from a $C_{3-40}$ alkyl group, a $C_{4-40}$ alkenyl group, and a $C_{3-40}$ haloalkyl group, where each of these groups can be linear or branched. In certain embodiments, $R^a$, at each occurrence, independently can be selected from a $C_{6-40}$ alkyl group, a $C_{6-40}$ alkenyl group, and a $C_{6-40}$ haloalkyl group, each of which can be linear or branched. In particular embodiments, $R^a$, at each occurrence, independently can be a $C_{6-40}$ alkyl group or a $C_{6-40}$ haloalkyl group, which can be either linear or branched. For example, $R^a$ can be a branched alkyl group selected from:

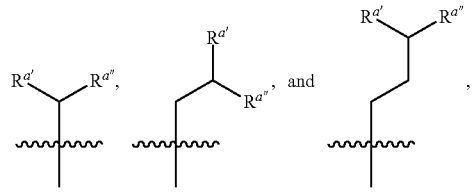

where $R^{a'}$ and $R^{a'''}$, independently are a linear $C_{1-20}$ alkyl group. In certain embodiments, $R^a$ can be a linear or branched $C_{2-40}$ alkenyl group (such as the linear or branched $C_{1-40}$ alkyl groups specified above but with one or more —$CH_2CH_2$— groups replaced by —CH=CH— groups). In certain embodiments, $R^a$ can be a linear or branched $C_{1-40}$ haloalkyl group (such as the linear or branched $C_{1-40}$ alkyl groups specified above but with one or more hydrogen atoms replaced by halogen atoms such as F).

Further examples of $R^a$ include linear or branched $C_{1-40}$ alkyl groups and $C_{2-40}$ alkenyl groups such as:

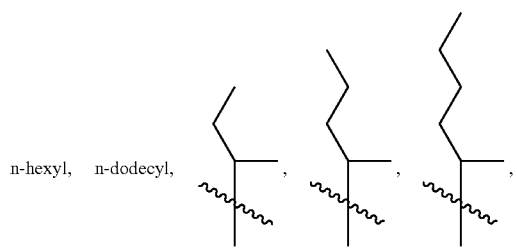

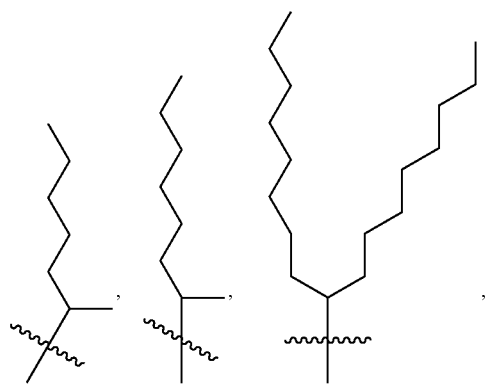

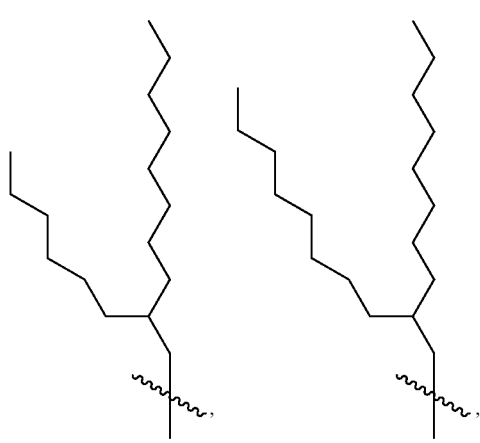

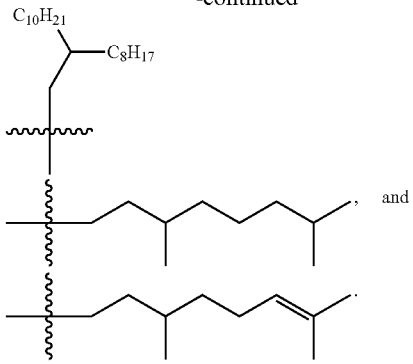

In certain embodiments, compounds of the present teachings can have a repeat unit of the formula:

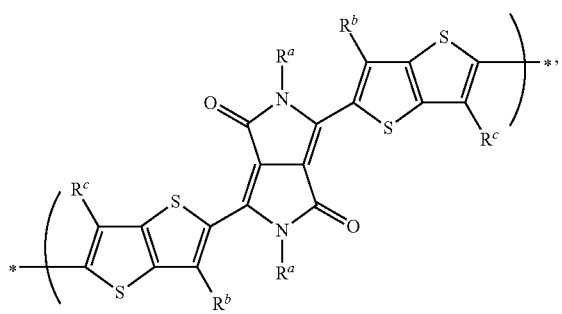

(Ia)

where $R^a$, $R^b$, and $R^c$ are as defined herein. For example, $R^a$ can be a $C_{6-40}$ alkyl group or a $C_{6-40}$ alkenyl group, particularly, a branched $C_{6-40}$ alkyl group; and each of $R^b$ and $R^c$ independently can be selected from H, a $C_{6-40}$ alkoxy group, and a $C_{6-40}$ alkylthio group.

In particular embodiments, compounds of the present teachings can have a repeat unit of the formula:

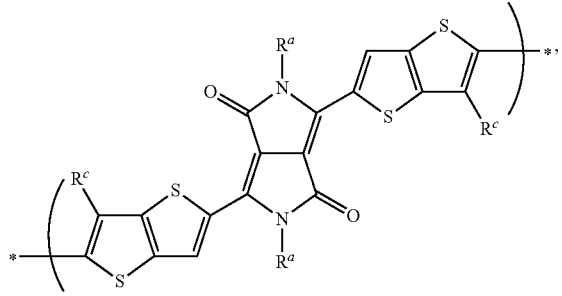

(Ib)

wherein $R^a$ and $R^c$ are as defined herein. For example, $R^a$ can be a $C_{6-40}$ alkyl group or a $C_{6-40}$ alkenyl group, particularly, a branched $C_{6-40}$ alkyl group; and $R^c$ can be selected from H, a $C_{6-40}$ alkoxy group, and a $C_{6-40}$ alkylthio group.

In various embodiments, the compounds of the present teachings can be oligomers or polymers of only one repeat unit, i.e., certain compounds of the present teachings can be represented by the formula:

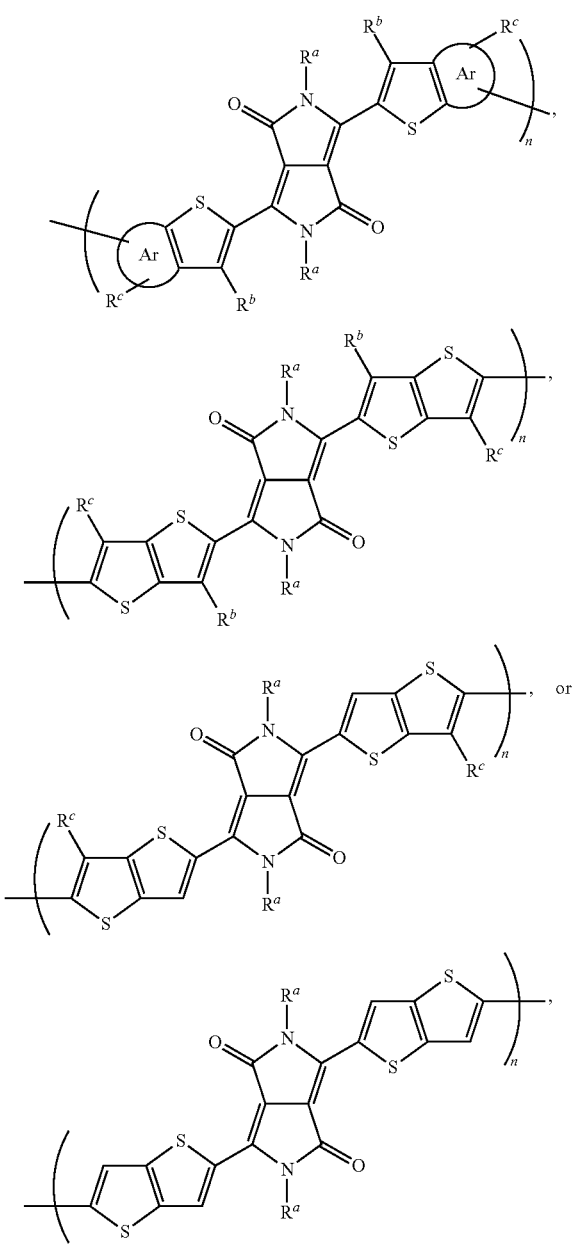

wherein $R^a$ can be a $C_{6-40}$ alkyl group; $R^c$ can be selected from H, a $C_{6-40}$ alkoxy group, and a $C_{6-40}$ alkylthio group; and the degree of polymerization (n) can be in the range of 2 to about 10,000. For example, for oligomeric compounds, the degree of polymerization can range from 2 to 9; and for polymeric compounds, the degree of polymerization can range from 10 to 10,000.

In certain embodiments, the compounds of the present teachings can be represented by the formula:

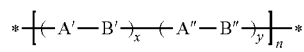

where A is a repeat unit of formula I, Ia, or Ib, and B is a second repeat unit that is different from A, and A and B can be repeated in a random or alternating manner; x and y represent the mole fractions of A and B, respectively, where $0.1 \leq x \leq 0.9$, $0.1 \leq y \leq 0.9$, and the sum of x and y is about 1; and n represents a degree of polymerization in the range from 2 to about 10,000 or greater.

In some embodiments, the present compounds can be represented by the formula:

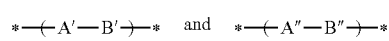

where A' and A" have the definition of A as described above, B' and B" have the definitions of B as described above, provided that A' and A" and/or B' and B" differ from each other in terms of substitution; x and y represent mole fractions, where $0.1 \leq x \leq 0.9$, $0.1 \leq y \leq 0.9$, and the sum of x and y is about 1; and n represents a degree of polymerization in the range from 2 to about 10,000 or greater. For example, one or more moieties in A' can be substituted while the same moieties in A are unsubstituted. Similarly, one of B' and B" can be substituted with one or more solubilizing groups while the other is unsubstituted. In various embodiments, the units

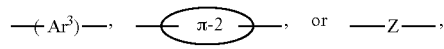

can be repeated in a random manner.

Accordingly, in one aspect, the present teachings relate to an oligomeric or polymeric compound including in its backbone at least two different repeat units (a first repeat unit and a second repeat unit that is different from the first repeat unit); wherein the first repeat unit (A) is a repeat unit of formula I (or formula Ia or formula Ib). The repeat unit B can be:

—(Ar³)—, —⟨π-2⟩—, or —Z—, where $Ar^3$, Z, and [π-2] are as defined herein; as well as combinations of two or more of $Ar^3$, Z, and [π-2].

More specifically, [π-2] can be an optionally substituted polycyclic moiety, for example, an optionally substituted $C_{8-24}$ aryl group or 8-24 membered heteroaryl group.

In particular embodiments, [π-2] can be represented by:

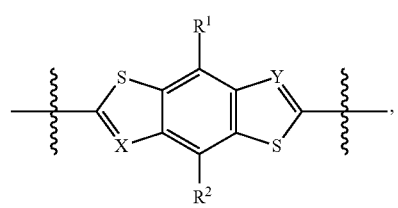

wherein X is N or $CR^3$ and Y is N or $CR^4$, i.e., an optionally substituted benzodithienyl moiety of the formula:

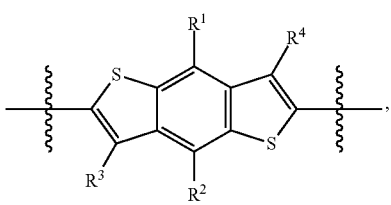

or an optionally substituted benzodithiazolyl moiety of the formula:

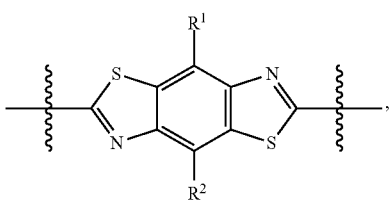

where $R^1$, $R^2$, $R^3$, and $R^4$ independently can be H or a substituent which can impart improved desirable properties to the compound as a whole. For example, certain substituents including one or more electron-withdrawing or electron-donating moieties can modulate the electronic properties of the compound, while substituents that include one or more aliphatic chains can improve the solubility of the compound in organic solvents.

More specifically, each of $R^1$, $R^2$, $R^3$, and $R^4$ independently can be selected from H, a halogen, CN, OR', SR', C(O)R', C(O)OR', SO$_2$R', a $C_{1-40}$ alkyl group, a $C_{2-40}$ alkenyl group, a $C_{2-40}$ alkynyl group, a $C_{1-40}$ haloalkyl group, a -L'-$C_{3-10}$ cycloalkyl group, a -L'-$C_{6-14}$ aryl group, a -L'-$C_{6-14}$ haloaryl group, a -L'-3-12 membered cycloheteroalkyl group, and a -L'-5-14 membered heteroaryl group;

wherein:

L', at each occurrence, independently is selected from a divalent $C_{1-20}$ alkyl group, a divalent $C_{1-20}$ haloalkyl group, and a covalent bond;

R' is selected from H, a $C_{1-40}$ alkyl group, a $C_{2-40}$ alkenyl group, a $C_{2-40}$ alkynyl group, and a $C_{1-40}$ haloalkyl group;

each of the $C_{1-40}$ alkyl group, the $C_{2-40}$ alkenyl group, the $C_{2-40}$ alkynyl group, the $C_{1-40}$ haloalkyl group, the $C_{1-20}$ alkyl group, the $C_{1-20}$ haloalkyl group, the $C_{3-10}$ cycloalkyl group, the $C_{6-14}$ aryl group, the $C_{6-14}$ haloaryl group, the 3-12 membered cycloheteroalkyl group, and the 5-14 membered heteroaryl group, optionally can be substituted with 1-10 substituents independently selected from a halogen, —CN, NO$_2$, OH, —NH$_2$, —NH(C$_{1-20}$ alkyl), —N(C$_{1-20}$ alkyl)$_2$, —S(O)$_2$OH, —CHO, —C(O)—C$_{1-20}$ alkyl, —C(O)OH, —C(O)—OC$_{1-20}$ alkyl, —C(O)NH$_2$, —C(O)NH—C$_{1-20}$ alkyl, —C(O)N(C$_{1-20}$ alkyl)$_2$, —OC$_{1-20}$ alkyl, —SiH$_3$, —SiH(C$_{1-20}$ alkyl)$_2$, —SiH$_2$(C$_{1-20}$ alkyl), and —Si(C$_{1-20}$ alkyl)$_3$; and one or more non-adjacent-CH— groups in the C$_{1-40}$ alkyl group, the C$_{2-40}$ alkenyl group, the C$_{2-40}$ alkynyl group, the $C_{1-40}$ haloalkyl group, the $C_{1-20}$ alkyl group, or the $C_{1-20}$ haloalkyl group, can be replaced by a group independently selected from —O—, —S—, —NH—, —N(C$_{1-20}$ alkyl)-, —Si(C$_{1-20}$ alkyl)$_2$-, —C(O)—, —C(O)O—, —OC(O)—, and —OC(O)O—.

In certain embodiments, at least one of $R^1$, $R^2$, $R^3$, and $R^4$ independently can be a linear or branched $C_{3-40}$ alkyl group, examples of which include an n-hexyl group, an n-octyl group, an n-dodecyl group, a 1-methylpropyl group, a 1-methylbutyl group, a 1-methylpentyl group, a 1-methylhexyl group, a 1-ethylpropyl group, a 1-ethylbutyl group, a 1,3-dimethylbutyl group, a 2-ethylhexyl group, a 2-hexyloctyl group, a 2-octyldodecyl group, and a 2-decyltetradecyl group. In certain embodiments, at least one of $R^1$, $R^2$, $R^3$, and $R^4$ independently can be a linear or branched $C_{3-40}$ alkenyl group (such as the linear or branched $C_{3-40}$ alkyl groups specified above but with one or more saturated bonds replaced by unsaturated bonds). In particular embodiments, at least one of $R^1$, $R^2$, $R^3$, and $R^4$ independently can be a branched $C_{3-20}$ alkyl group or a branched $C_{3-20}$ alkenyl group.

In certain embodiments, at least one of $R^1$, $R^2$, $R^3$, and $R^4$ independently can be a linear or branched $C_{6-40}$ alkyl or alkenyl group, an arylalkyl group (e.g., a benzyl group) substituted with a linear or branched $C_{6-40}$ alkyl or alkenyl group, an aryl group (e.g., a phenyl group) substituted with a linear or branched $C_{6-40}$ alkyl or alkenyl group, or a biaryl group (e.g., a biphenyl group) substituted with a linear or branched $C_{6-40}$ alkyl or alkenyl group, wherein each of these groups optionally can be substituted with 1-5 halo groups (e.g., F). In some embodiments, at least one of $R^1$, $R^2$, $R^3$, and $R^4$ independently can be a biaryl group wherein the two aryl groups are covalently linked via a linker. For example, the linker can be a divalent $C_{1-40}$ alkyl group wherein one or more non-adjacent CH$_2$ groups optionally can be replaced by —O—, —S—, or —Se—, i.e., O, S, and/or Se atoms are not linked directly to one another. The linker can include other heteroatoms and/or functional groups as described herein.

In various embodiments, the conjugated polycyclic moiety:

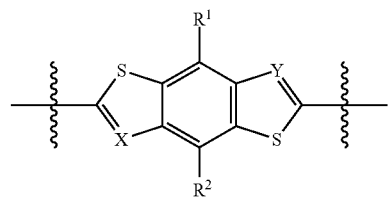

can be symmetrically substituted, that is, $R^1$ and $R^2$ can be identical groups, and/or when X and Y are CR$^3$ and CR$^4$, respectively, $R^3$ and $R^4$ can be identical groups. For example, each of $R^1$ and $R^2$ and/or each of $R^3$ and $R^4$ can be a branched $C_{3-40}$ alkyl group, a branched $C_{3-40}$ haloalkyl group, a branched $C_{3-40}$ alkoxy group, or a branched $C_{3-40}$ alkylthio group, each of which optionally can be substituted with a silyl group (e.g., —SiH$_3$, —SiH(C$_{1-6}$ alkyl)$_2$, —SiH$_2$(C$_{1-6}$ alkyl), and —Si(C$_{1-6}$ alkyl)$_3$).

Accordingly, certain compounds of the present teachings can have a repeat unit (A-B) represented by the formula:

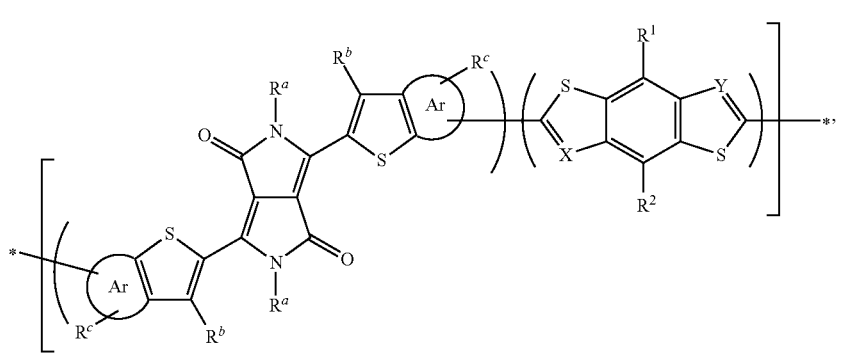

wherein:
Ar is a monocyclic aryl or heteroaryl group;
$R^a$ can be selected from H, a $C_{1-40}$ alkyl group, a $C_{2-40}$ alkenyl group, a $C_{2-40}$ alkynyl group, and a $C_{1-40}$ haloalkyl group, wherein:
  each of the $C_{1-40}$ alkyl group, the $C_{2-40}$ alkenyl group, the $C_{2-40}$ alkynyl group, the $C_{1-40}$ haloalkyl group, optionally can be substituted with 1-10 substituents independently selected from a halogen, —CN, $NO_2$, OH, —$NH_2$, —NH($C_{1-20}$ alkyl), —N($C_{1-20}$ alkyl)$_2$, —S(O)$_2$OH, —CHO, —C(O)—$C_{1-20}$ alkyl, —C(O)OH, —C(O)—O$C_{1-20}$ alkyl, —C(O)$NH_2$, —C(O)NH—$C_{1-20}$ alkyl, —C(O)N($C_{1-20}$ alkyl)$_2$, —O$C_{1-20}$ alkyl, —$SiH_3$, —SiH($C_{1-20}$ alkyl)$_2$, —$SiH_2$($C_{1-20}$ alkyl), and —Si($C_{1-20}$ alkyl)$_3$; and
  one or more non-adjacent —$CH_2$— groups in the $C_{1-40}$ alkyl group, the $C_{2-40}$ alkenyl group, the $C_{2-40}$ alkynyl group, and the $C_{1-40}$ haloalkyl group can be replaced by a group independently selected from —O—, —S—, —NH—, —N($C_{1-20}$ alkyl)-, —C(O)—, —C(O)O—, and —Si($C_{1-20}$ alkyl)$_2$-;
each of $R^b$ and $R^c$ independently is H or -L-R;
X is N or $CR^3$;
Y is N or $CR^4$; and
each of $R^1$, $R^2$, $R^3$ and $R^4$ independently is selected from H and -L-R,
  wherein:
    L, at each occurrence, independently is selected from O, S, and a covalent bond; and
    R, at each occurrence, independently is a $C_{1-40}$ alkyl group.

In certain embodiments, compounds of the present teachings can have a repeat unit (A-B) represented by the formula:

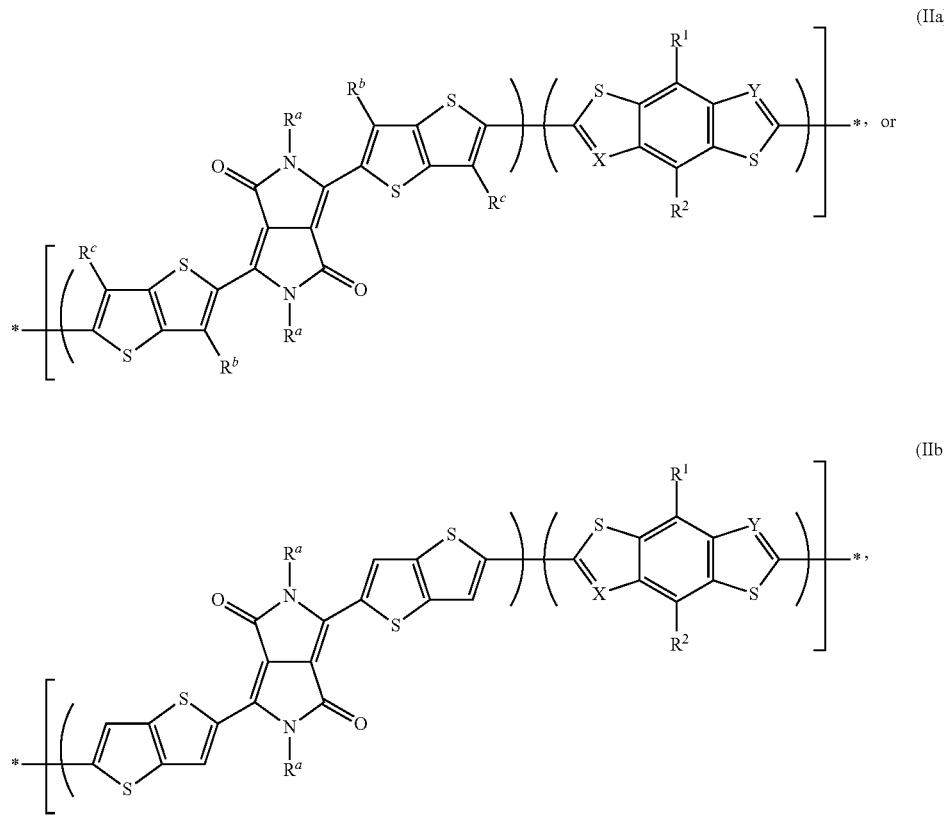

where $R^a$, $R^b$, $R^c$, $R^1$, $R^2$, X and Y are as defined herein. For example, $R^a$ can be a branched $C_{6-40}$ alkyl group; $R^1$ and $R^2$ can be a branched $C_{6-40}$ alkyl or alkoxy group; and and X and Y can be CH.

In other embodiments, [π-2] can be an optionally substituted anthracene-2,6-diyl moiety represented by the formula:

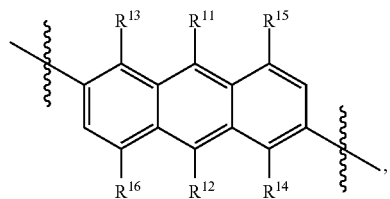

where each of $R^{11}$, $R^{12}$, $R^{13}$, $R^{14}$, $R^{15}$, and $R^{16}$ independently can be selected from H and -L-R, where L and R are as defined herein.

In other embodiments, [π-2] can be an optionally substituted polycyclic moiety, for example, an optionally substituted $C_{8-24}$ aryl group or 8-24 membered heteroaryl group selected from:

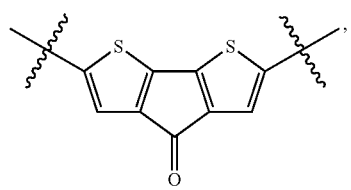

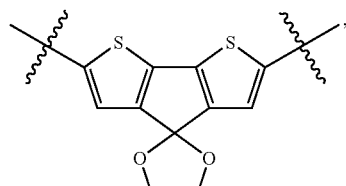

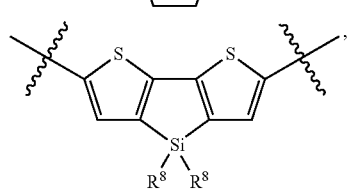

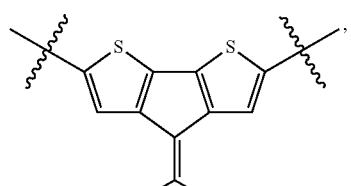

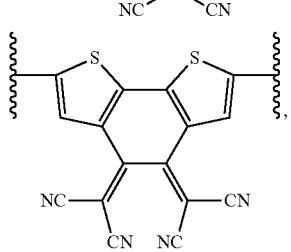

-continued

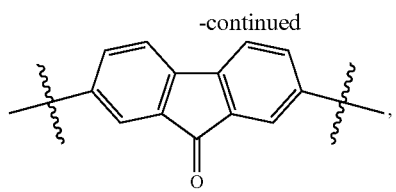

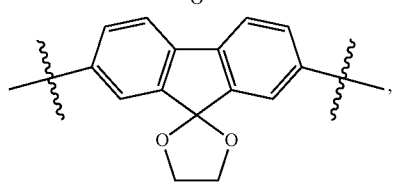

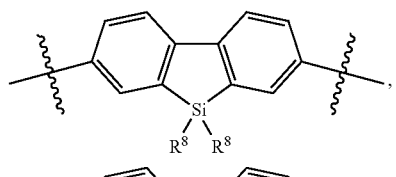

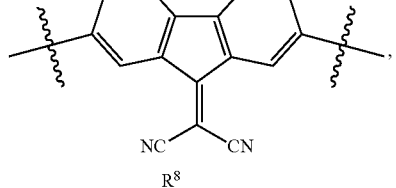

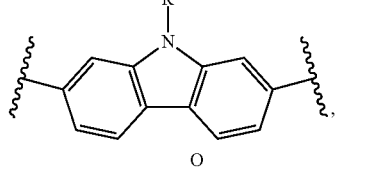

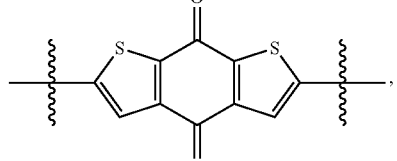

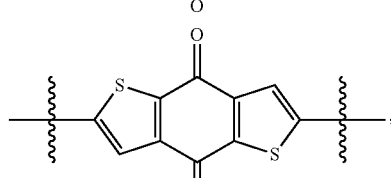

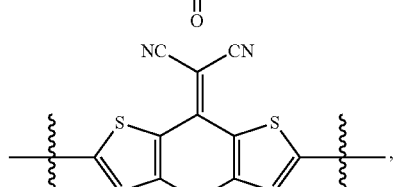

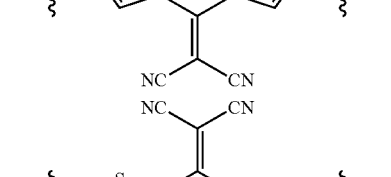

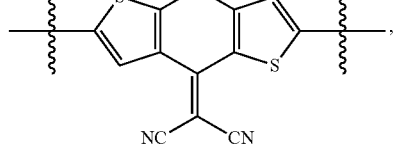

-continued
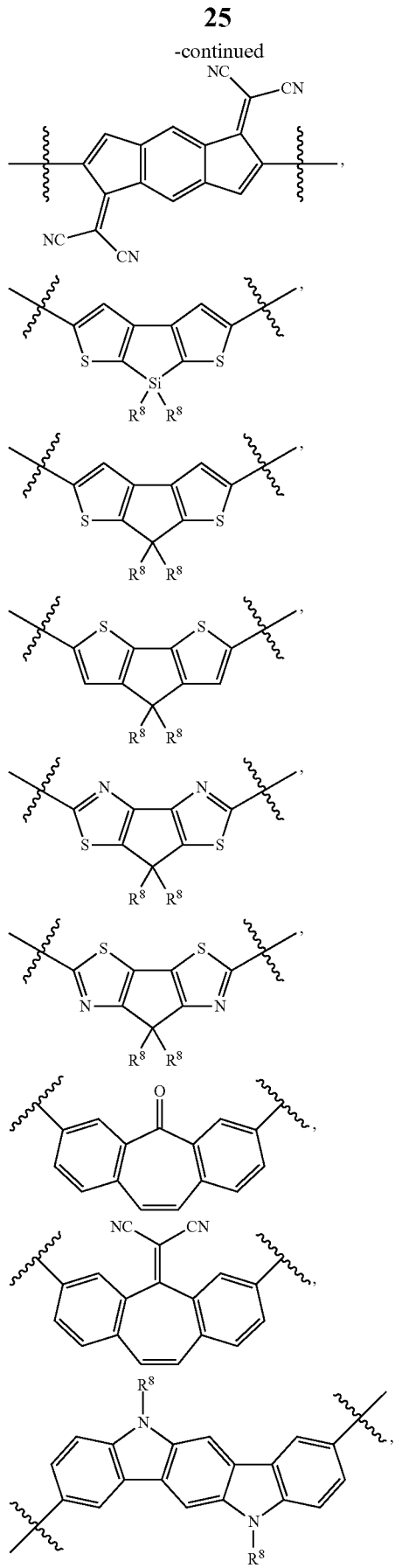
-continued
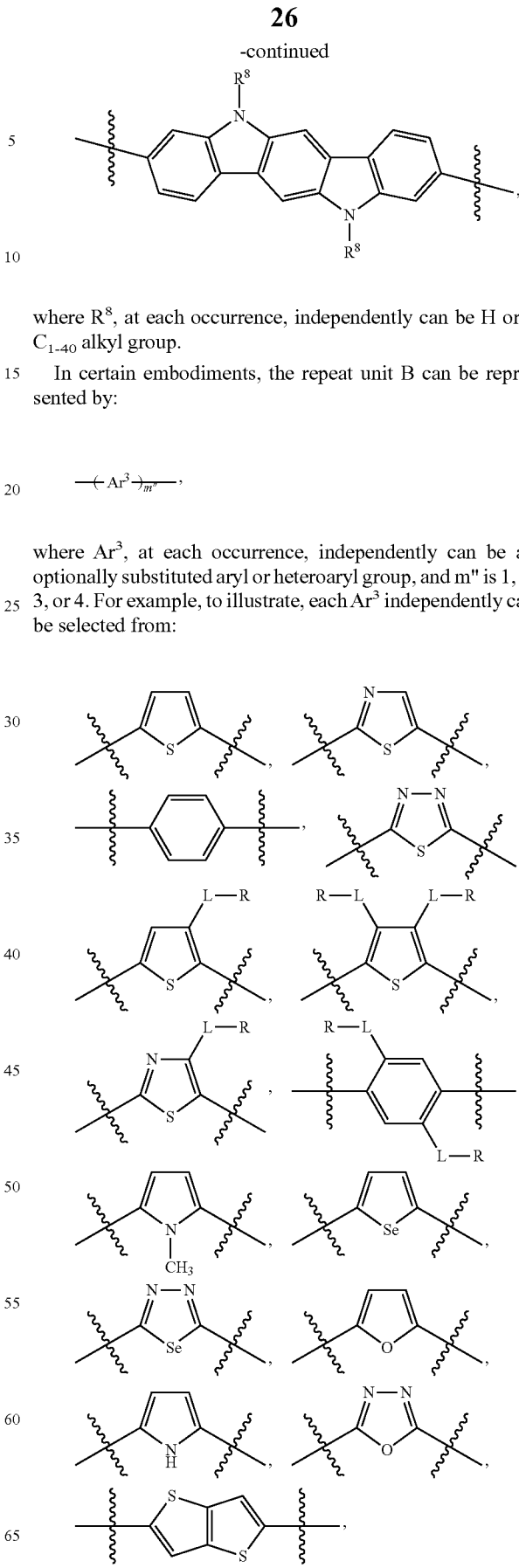
where $R^8$, at each occurrence, independently can be H or a $C_{1-40}$ alkyl group.
In certain embodiments, the repeat unit B can be represented by:
$$-(Ar^3)_{m''}-,$$
where $Ar^3$, at each occurrence, independently can be an optionally substituted aryl or heteroaryl group, and m" is 1, 2, 3, or 4. For example, to illustrate, each $Ar^3$ independently can be selected from:

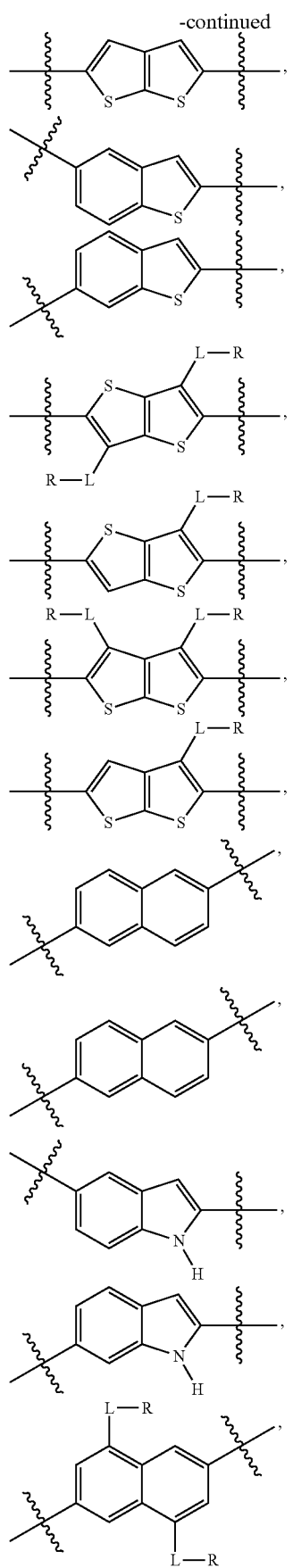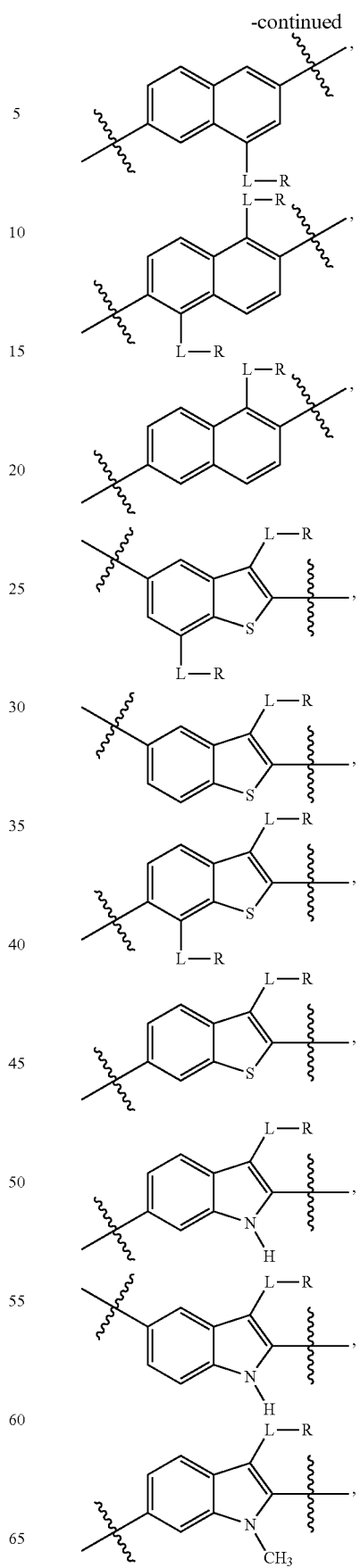

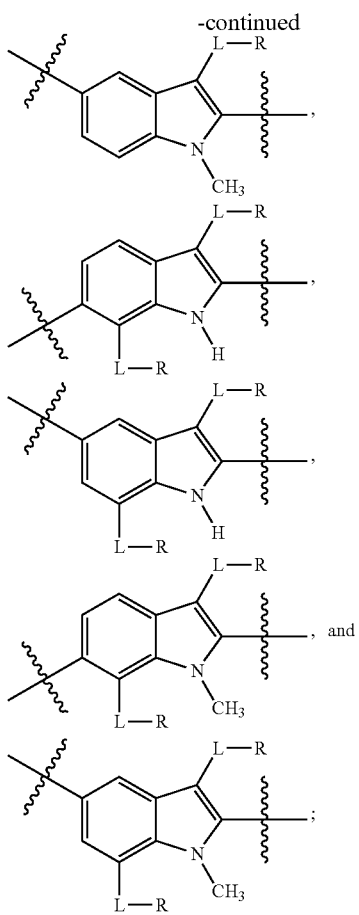
where L and R are as defined herein.
In certain embodiments, the repeat unit B can be represented by the formula:
—(Ar³)-[π-2]-(Ar³)—,
where Ar³ and [π-2] are as defined herein. For example, Ar³ can be an optionally substituted thienyl group, and [π-2] can be
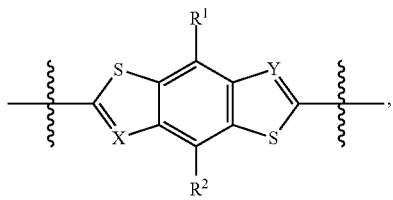
where R¹, R², X and Y are as defined herein, or [π-2] can be selected from:
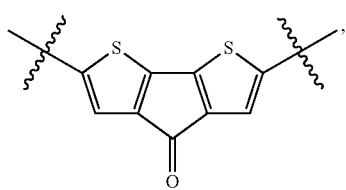
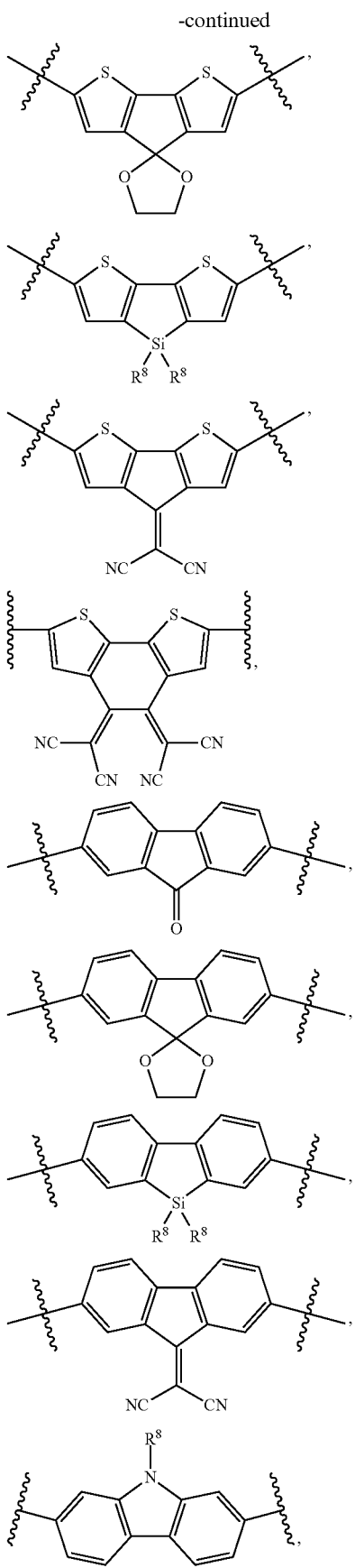

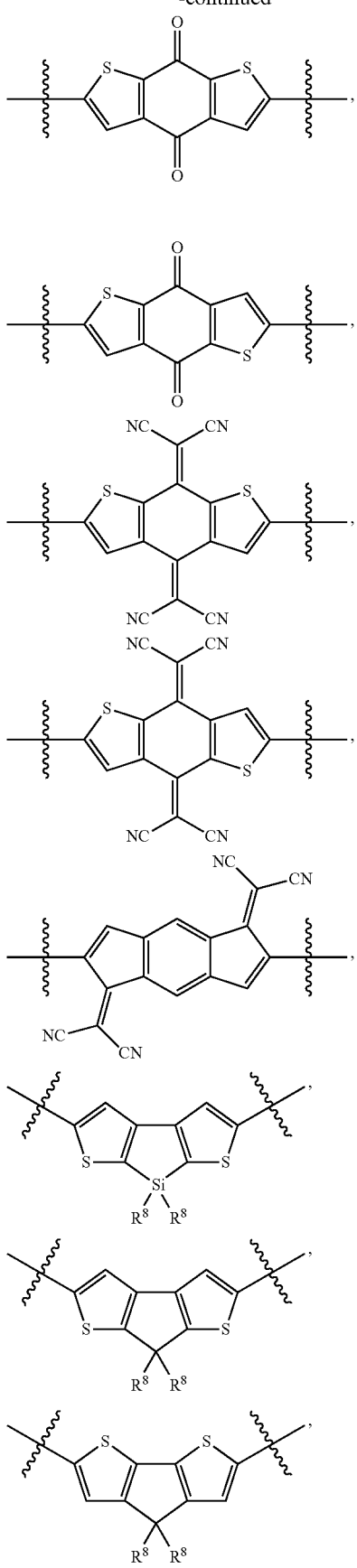
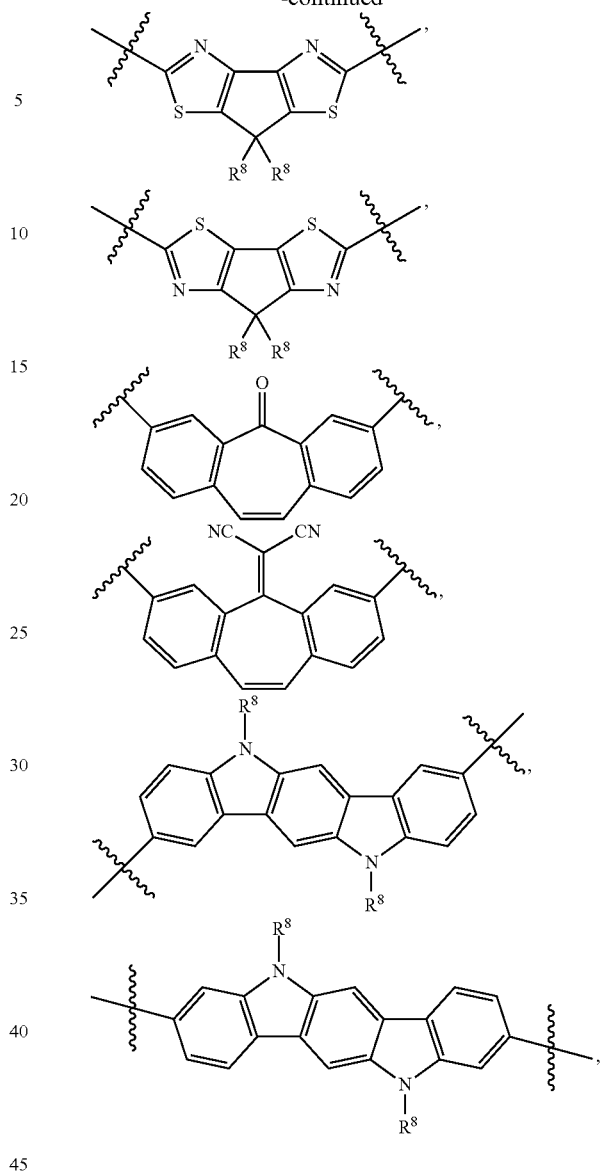
where $R^8$, at each occurrence, independently can be H or a $C_{1-40}$ alkyl group.
In certain embodiments, the repeat unit B can be represented by the formula:
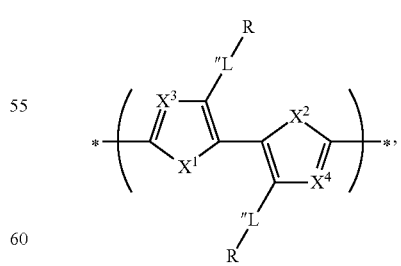
wherein:
L″, at each occurrence, independently is selected from —CH$_2$—, —O—, —S—, and —Se—;
$X^1$ and $X^2$, at each occurrence, independently are selected from S, O, and Se;

X³ and X⁴, at each occurrence, independently are selected from N, CH, and CF; and R is as defined herein.

In various embodiments, the repeat unit B can include a linear conjugated linker Z, which can be a conjugated system by itself (e.g., including two or more double or triple bonds) or can form a conjugated system with its neighboring components. For example, Z can be a divalent ethenyl group (i.e., having one double bond), a divalent ethynyl group (i.e., having one tripe bond), a $C_{4-40}$ alkenyl or alkynyl group that includes two or more conjugated double or triple bonds, or some other non-cyclic conjugated systems that can include heteroatoms such as Si, N, P, and the like. For example, Z can be selected from:

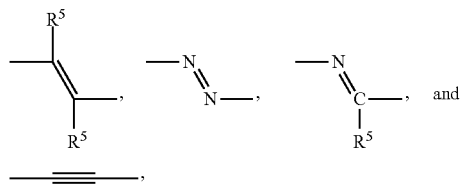

wherein $R^5$ is as defined herein. In certain embodiments, Z can be selected from:

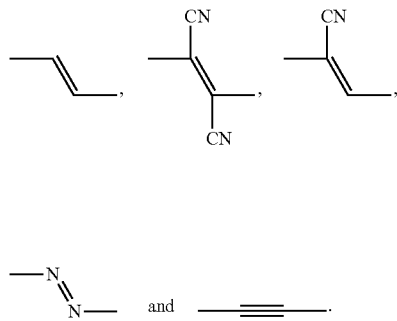

In one aspect, the present teachings relate to the synthesis of an oligomeric or polymeric compound including in its backbone a repeat unit of formula I, Ia, or Ib. Generally, an oligomeric or polymeric compound having the repeat unit:

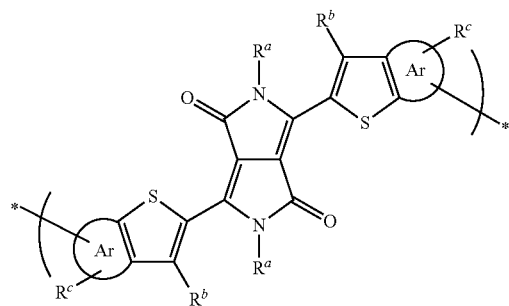

(I)

according to the present teachings can be prepared, in part, from the starting compound:

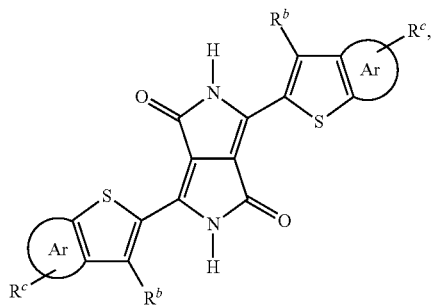

which can be functionalized subsequently to include (a) solubilizing groups $R^a$ (e.g., by alkylation) and/or (b) polymerizable groups that allow either self-polymerization or co-polymerization with one or more other units. Such self-polymerization and co-polymerization can be effected via various polymerization schemes including metal-catalyzed coupling reactions known by those skilled in the art, such as Stille coupling, Suzuki coupling, Negishi coupling, Kumada coupling, and Yamamoto coupling. For example, the polymerizable groups can be selected from a halogen (e.g., Cl, Br, I), a sulfonate group, an organotin moiety, and a boronic ester moiety.

Specifically, a compound having the formula:

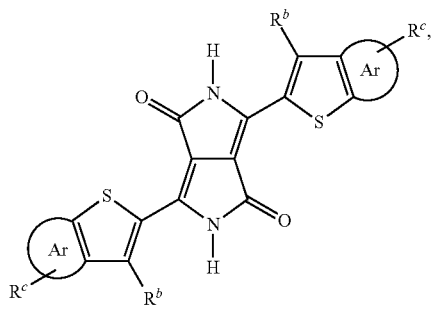

can be prepared by reacting a succinic acid derivative (preferably a succinic acid ester) with a compound of the formula:

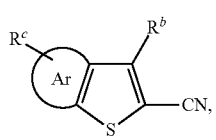

where Ar, $R^b$, and $R^c$ are as defined herein.

Various embodiments of the repeat unit B, if present, can be prepared from commercially available starting materials, compounds known in the literature, or via other readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the compounds described herein.

The processes described herein can be monitored according to any suitable method known in the art. For example, product formation can be monitored by spectroscopic means, such as nuclear magnetic resonance spectroscopy (NMR, e.g., $^1H$ or $^{13}C$), infrared spectroscopy (IR), optical absorption/emission spectroscopy (e.g., UV-visible), mass spectrometry (MS), or by chromatography such as high pressure liquid chromatography (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

Certain embodiments disclosed herein can be stable in ambient conditions ("ambient stable") and soluble in common solvents. As used herein, a compound can be considered electrically "ambient stable" or "stable at ambient conditions" when a transistor incorporating the compound as its semiconducting material exhibits a carrier mobility that is maintained at about its initial measurement when the compound is exposed to ambient conditions, for example, air, ambient temperature, and humidity, over a period of time. For example, a compound according to the present teachings can be described as ambient stable if a transistor incorporating the compound shows a carrier mobility that does not vary more than 20% or more than 10% from its initial value after exposure to ambient conditions, including, air, humidity and temperature, over a 3 day, 5 day, or 10 day period. In addition, a compound can be considered ambient stable if the optical absorption of the corresponding film does not vary more than 20% (preferably, does not vary more than 10%) from its initial value after exposure to ambient conditions, including air, humidity and temperature, over a 3 day, 5 day, or 10 day period.

As used herein, a compound can be considered soluble in a solvent when at least 0.1 mg of the compound can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl)ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methypyrrolidone.

The present compounds can be fabricated into various articles of manufacture using solution processing techniques in addition to other more expensive processes such as vapor deposition. Various solution processing techniques have been used with organic electronics. Common solution processing techniques include, for example, spin coating, drop-casting, zone casting, dip coating, blade coating, or spraying. Another example of solution processing technique is printing. As used herein, "printing" includes a noncontact process such as inkjet printing, microdispensing and the like, and a contact process such as screen-printing, gravure printing, offset printing, flexographic printing, lithographic printing, pad printing, microcontact printing and the like.

Compounds of the present teachings can be used alone or in combination with other compounds to prepare semiconductor materials (e.g., compositions and composites), which in turn can be used to fabricate various articles of manufacture, structures, and devices. In some embodiments, semiconductor materials incorporating one or more compounds of the present teachings can exhibit p-type semiconductor activity, ambipolar activity, light absorption, and/or light emission.

The present teachings, therefore, further provide methods of preparing a semiconductor material. The methods can include preparing a composition (e.g., a solution or dispersion) that includes one or more compounds disclosed herein dissolved or dispersed in a liquid medium such as a solvent or a mixture of solvents, depositing the composition on a substrate to provide a semiconductor material precursor, and processing (e.g., heating) the semiconductor precursor to provide a semiconductor material (e.g., a photoactive layer) that includes a compound disclosed herein. In various embodiments, the liquid medium can be an organic solvent, an inorganic solvent such as water, or combinations thereof. In some embodiments, the composition can further include one or more additives independently selected from viscosity modulators, detergents, dispersants, binding agents, compatibilizing agents, curing agents, initiators, humectants, antifoaming agents, wetting agents, pH modifiers, biocides, and bacteriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatibilizing agent, and/or an antifoaming agent. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, drop-casting, zone casting, dip coating, blade coating, or spraying.

Various articles of manufacture including optical devices, optoelectronic devices, and electronic devices such as thin film semiconductors, photovoltaic devices, photodetectors, organic light emitting devices such as organic light emitting transistors (OLETs), that make use of the compounds disclosed herein are within the scope of the present teachings as are methods of making the same. The present compounds can offer processing and operation advantages in the fabrication and/or the use of these devices.

For example, articles of manufacture such as the various devices described herein can be an optical or optoelectronic device including a first electrode, a second electrode, and a photoactive component disposed between the first electrode and the second electrode, where the photoactive component includes a compound of the present teachings.

In various embodiments, the optical or optoelectronic device can be configured as a solar cell, in particular, a bulk heterojunction solar cell. Compounds of the present teachings can exhibit broad optical absorption and/or a tuned redox properties and bulk carrier mobilities, making them desirable for such applications. In various embodiments, the bulk heterojunction solar cells according to the present teachings can incorporate a blend material (e.g., a blended thin film) including a compound of the present teachings as the donor material and an acceptor material as the photoactive layer.

Typical acceptor materials include fullerene-based compounds. Fullerenes useful in the present teachings can have a broad range of sizes (number of carbon atoms per molecule). The term fullerene as used herein includes various cage-like molecules of pure carbon, including Buckministerfullerene ($C_{60}$) "bucky ball" and the related "spherical" fullerenes as well as carbon nanotubes. Fullerenes can be selected from those known in the art ranging from, for example, C20-C1000. In certain embodiments, the fullerene can be selected from the range of C60 to C96. In particular embodiments, the fullerene can be C60 or C70, such as [60]PCBM, or [70]PCBM. In some embodiments, chemically modified fullerenes can be used, provided that the modified fullerene retains acceptor-type and electron mobility characteristics. Other acceptor materials can be used in place of fullerenes, provided that they have the required acceptor-type and electron mobility characteristics. For example, the acceptor material can be various organic small molecules, polymers, carbon nanotubes, or inorganic particles (quantum dots, quantum rods, quantum tripods, $TiO_2$, ZnO etc.).

A photoactive component according to the present teachings can be prepared as a blended thin film deposited from a solution or dispersion containing a mixture of one or more of the present compounds and an acceptor compound such as fullerene (e.g., PCBM). The ratio of the present polymer to the acceptor compound can range from about 10:1 to about 1:10 by weight; for example, from about 5:1 to about 1:5 by weight, from about 3:1 to about 1:3 by weight, or from about 2:1 to about 1:2 by weight. The photoactive layer also can contain a polymeric binder, which can be present from about 5 to about 95% by weight. The polymeric binder, for example, can be a semicrystalline polymer selected from polystyrene (PS), high density polyethylene (HDPE), polypropylene (PP) and polymethylmethacrylate (PMMA).

FIG. 1 illustrates a representative structure of a bulk-heterojunction organic solar cell which can incorporate one or more compounds of the present teachings as the donor and/or acceptor materials. As shown, a representative solar cell generally includes a substrate 20, an anode 22, a cathode 26, and a photoactive layer 24 between the anode and the cathode that can incorporate one or more compounds of the present teachings as the electron donor (p-channel) and/or electron acceptor (n-channel) materials. In some embodiments, an optional smoothing layer can be present between the anode and the photoactive layer.

The substrate can be, for example, glass or a flexible substrate (e.g., plastic). The electrodes can be composed of metals or transparent conducting oxides such as indium tin oxide (ITO), gallium indium tin oxide (GITO), and zinc indium tin oxide (ZITO). For example, the cathode can be composed of aluminum or calcium, while the anode can be composed of ITO.

In various embodiments, an optional smoothing layer can be present between the anode and the photoactive layer. For example, the smoothing layer can include a film of 3,4-polyethylenedioxythiophene (PEDOT), or 3,4-polyethylenedioxythiophene:polystyrene-sulfonate (PEDOT:PSS).

In certain embodiments, a solar cell according to the present teachings can include a transparent glass substrate onto which an electrode layer (anode) made of indium tin oxide (ITO) is applied. This electrode layer can have a relatively rough surface, and a smoothing layer made of a polymer, typically PEDOT:PSS made electrically conductive through doping, can be applied on top of the electrode layer to enhance its surface morphology. The photoactive layer generally is made of two components as described above, and can have a layer thickness of, e.g., about 100 nm to a few μm. Before a counter electrode is applied (cathode), an electrically insulating transition layer can be applied onto the photoactive layer. This transition layer can be made of an alkali halogenide, e.g., LiF, and can be vapor-deposited in vacuum.

Another aspect of the present teachings relates to methods of fabricating an organic light-emitting transistor or an organic light-emitting diode (OLED) that incorporates one or more semiconductor materials of the present teachings. For example, in an OLED, one or more compounds of the present teachings can be used as electron-transporting and/or emissive and/or hole-transporting materials. An OLED generally includes a substrate, a transparent anode (e.g., ITO), a cathode (e.g., metal), and one or more organic layers which can incorporate one or more compounds of the present teachings as hole-transporting (p-channel) and/or emissive and/or electron-transporting (n-channel) materials. In embodiments where the present compounds only have one or two of the properties of hole transport, electron transport, and emission, the present compounds can be blended with one or more further organic compounds having the remaining required property or properties.

In other embodiments, the article of manufacture can be an electronic or optoelectronic device (e.g., an organic light-emitting transistor) including a first electrode, a second electrode, and a semiconducting component in contact with the first electrode and the second electrode, where the semiconducting component includes a compound of the present teachings. These devices can include a composite having a semiconducting component (or semiconductor material) of the present teachings and a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., polycarbonate, polyester, polystyrene, polyhaloethylene, polyacrylate), and self-assembled superlattice/self-assembled nanodielectric (SAS/SAND) materials (e.g., as described in Yoon, M-H. et al., *PNAS,* 102 (13): 4678-4682 (2005), the entire disclosure of which is incorporated by reference herein), as well as hybrid organic/inorganic dielectric materials (e.g., described in U.S. patent application Ser. No. 11/642,504, the entire disclosure of which is incorporated by reference herein). In some embodiments, the dielectric component can include the crosslinked polymer blends described in U.S. patent application Ser. Nos. 11/315,076, 60/816,952, and 60/861,308, the entire disclosure of each of which is incorporated by reference herein. The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene) poly(styrenesulfonate) (PEDOT:PSS), polyaniline (PANI), polypyrrole (PPy)). One or more of the composites described herein can be embodied within various organic electronic, optical, and optoelectronic devices such as organic photovoltaics (OPV) and organic light-emitting transistors (OLETs) as described above.

The following examples are provided to illustrate further and to facilitate the understanding of the present teachings and are not in any way intended to limit the invention.

EXAMPLE 1

Synthesis

EXAMPLE 1A

Preparation of 3,6-bis-thieno[3,2-b]thiophen-2-yl-2,5-dihydropyrrolo[3,4-c]pyrrole-1,4-dione Step 1: Preparation of 3a,6a-dihydro-thieno[3,2-b]thiophene-2-carboxylic acid amide

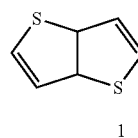

A mixture of 3a,6a-dihydro-thieno[3,2-b]thiophene-2-carboxylic acid 1 (5.0 g, 26.8 mmol, Fuller et al., *J. Chem. Soc., Perkin Trans* 1, 3465-3470) in 50 mL of thionyl chloride (SOCl$_2$) was heated to reflux for 3 hours before excess SOCl$_2$ was removed with a rotary evaporator. Dichloromethane (125 mL) was added and the resulting solution was added dropwise into a mixture of NH$_4$OH (150 mL, 28-30%) in 200 mL of dichloromethane cooled in an ice/salt bath with the reaction temperature kept below −5° C. White precipitate formed immediately. The mixture was stirred for 20 minutes. The precipitate was collected by vacuum filtration and washed with water three times and weighed 4.87 g after drying in vacuo at 60° C. (yield 98%). $^1$H NMR (DMSO-d$_6$, 500 MHz): δ 8.10 (b, 1H), 8.08 (s, 1H), 7.85 (d, 1H, J=5.0), 7.53 (b, 1H), 7.50 (d, 1H, J=5.0), $^{13}$C NMR (DMSO-d$_6$, 500 MHz): δ 168.51, 147.06, 146.98, 143.57, 136.55, 126.43, 125.60.

Step 2: Preparation of 3a,6a-Dihydro-thieno[3,2-b]thiophene-2-carbonitrile

3a,6a-Dihydro-thieno[3,2-b]thiophene-2-carboxylic acid amide 2 (4.0 g, 21.6 mmol) was mixed with 50 mL of POCl$_3$ and the mixture was heated to reflux for 2 hours before POCl$_3$ was removed with a rotary evaporator. Dichloromethane (100 mL) was added and then 100 mL of ice water was added dropwise. The organic layer was further washed with water (30 mL) twice before the solvent was removed. The brown oil obtained was passed through a short column of silica gel with dichloromethane as eluent. After removal of the solvent, a yellow oil was obtained (2.4 g, yield 67%). $^1$H NMR (CDCl$_3$, 500 MHz): δ 7.80 (s, 1H), 7.72 (d, 1H, J=5.0), 7.30 (d, 1H, J=5.0); $^{13}$C NMR (CDCl$_3$, 500 MHz): δ 143.39, 138.27, 133.52, 129.72, 119.38, 114.60, 110.27.

Step 3: Preparation of 3,6-bis-thieno[3,2-b]thiophen-2-yl-2,5-dihydro-pyrrolo[3,4-c]pyrrole-1,4-dione

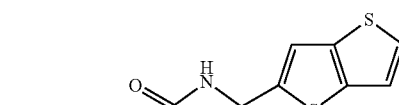

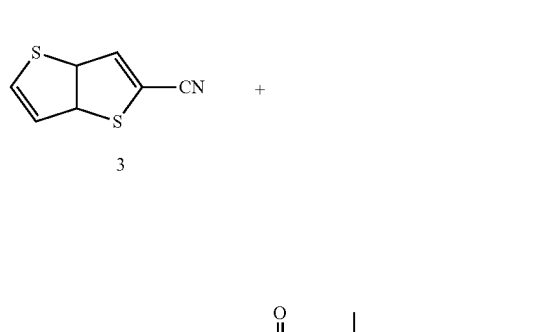

A 50 mL flask was flushed with argon to which were added potassium tert-butoxide (t-BuOK) (1.01 g, 9.0 mmol) and 10 mL of t-amyl alcohol, which was then warmed to 60° C. until all solids were dissolved. 3a,6a-Dihydro-thieno[3,2-b]thiophene-2-carbonitrile 3 (1.0 g, 6.0 mmol) in 5 mL of t-amyl alcohol was added in one portion. The solution was further warmed to 85° C. for 20 minutes to dissolve all solids. Succinic acid diisopropyl ester (0.60 g, 3.0 mmol) in 2 mL of t-amyl alcohol was added and the reaction mixture was heated at 100° C. overnight. The temperature was decreased to 50° C. before 20 mL of methanol and 5 mL of acetic acid were added. Deep red powder was collected by vacuum filtration and washed with water and hot methanol. After drying in vacuo, the crude product (1.30 g) was pure enough for alkylation.

EXAMPLE 1B

Preparation of 2,5-bis-(2-butyl-octyl)-3,6-bis-thieno[3,2-b]thiophen-2-yl-2,5-dihydro-pyrrolo[3,4-c]pyrrole-1,4-dione

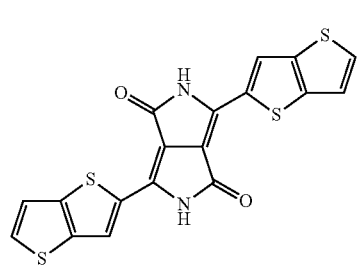  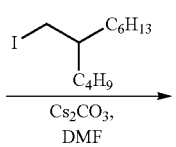

4

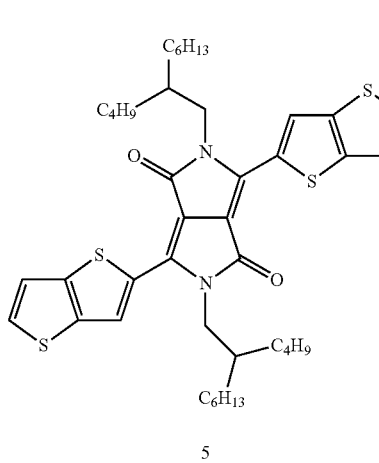

5

A 100 mL flask was charged with 3,6-bis-thieno[3,2-b]thiophen-2-yl-2,5-dihydro-pyrrolo[3,4-c]pyrrole-1,4-dione 4 (1.2 g, 2.9 mmol), 5-iodomethyl-undecane (2.59 g, 8.7 mmol), Cs$_2$CO$_3$ (3.13 g, 9.6 mmol) and then purged with argon for 10 minutes before 50 mL of dimethylformamide (DMF) was added. The mixture was heated at 60° C. for 36 hours and then cooled to room temperature. 50 mL of chloroform was added. The organic layer was washed with water (50 mL×3) and then dried over anhydrous Na$_2$SO$_4$. A black solid was obtained after removal of the solvent and precipitation from methanol. The product was purified by column chromatography with a chloroform/hexane mixture (1:1 v/v) as eluent and weighed 0.78 g (yield 36%) after drying. $^1$H NMR (CDCl$_3$, 500 MHz): δ 9.28 (s, 2H), 7.61 (d, 2H, J=5.5), 7.30 (d, 2H, J=5.5), 4.01 (d, 4H, J=8), 1.99 (b, 2H), 1.33 (m, 32H), 0.84 (m, 12H); $^{13}$C NMR (CDCl$_3$, 500 MHz): δ 161.74, 143.36, 140.59, 140.25, 132.07, 131.19, 127.52, 119.35, 108.37, 46.52, 37.86, 31.80, 31.15, 30.88, 29.74, 28.43, 26.16, 23.11, 22.65, 14.12, 14.07.

EXAMPLE 1C

Preparation of 3,6-bis-(5-bromo-thieno[3,2-b]thiophen-2-yl)-2,5-bis-(2-butyl-octyl)-2,5-dihydro-pyrrolo[3,4-c]pyrrole-1,4-dione

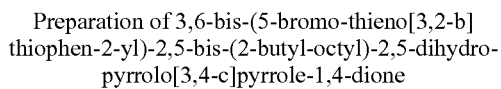

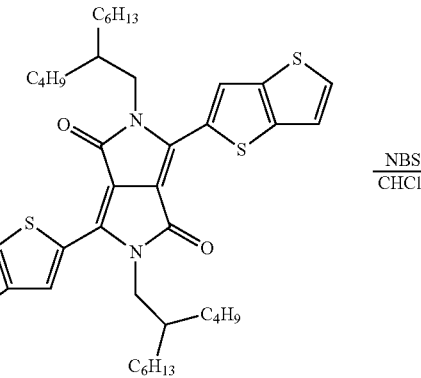

5

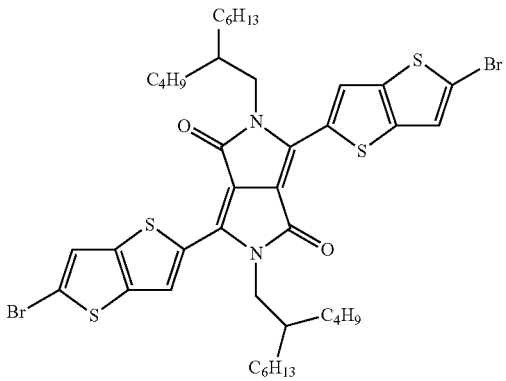

6

2,5-Bis-(2-butyl-octyl)-3,6-bis-thieno[3,2-b]thiophen-2-yl-2,5-dihydro-pyrrolo[3,4-c]pyrrole-1,4-dione 5 (0.7 g, 0.934 mmol) was purged with argon before 30 mL of chloroform was added. The system was kept in absence of light before 0.466 g of NBS (2.06 mmol) was added in portions. The mixture was stirred overnight before quenching with 50 mL of water. The aqueous layer was further extracted with chloroform (50 mL) twice. The combined organic layers were dried over anhydrous Na$_2$SO$_4$. The product was further purified by a silica gel column with chloroform as eluent after removal of the solvent. Recrystallization in iso-propanol/methanol gave a red solid product (0.74 g, yield 87.3%). $^1$H NMR (CDCl$_3$, 500 MHz): δ 9.20 (s, 2H), 7.33 (s, 2H), 4.05 (d, 4H, J=7.5), 1.96 (b, 2H), 1.21 (m, 32H), 0.85 (m, 12H); $^{13}$C NMR (CDCl$_3$, 500 MHz): δ 161.62, 142.01, 140.42, 140.30, 130.40, 126.90, 122.11, 119.01, 108.48, 49.54, 37.89, 31.79, 31.12, 30.86, 29.72, 28.42, 26.14, 23.09, 22.65, 14.11, 14.06.

EXAMPLE 2

Polymer Synthesis

EXAMPLE 2A

Polymer Synthesis (HP4)

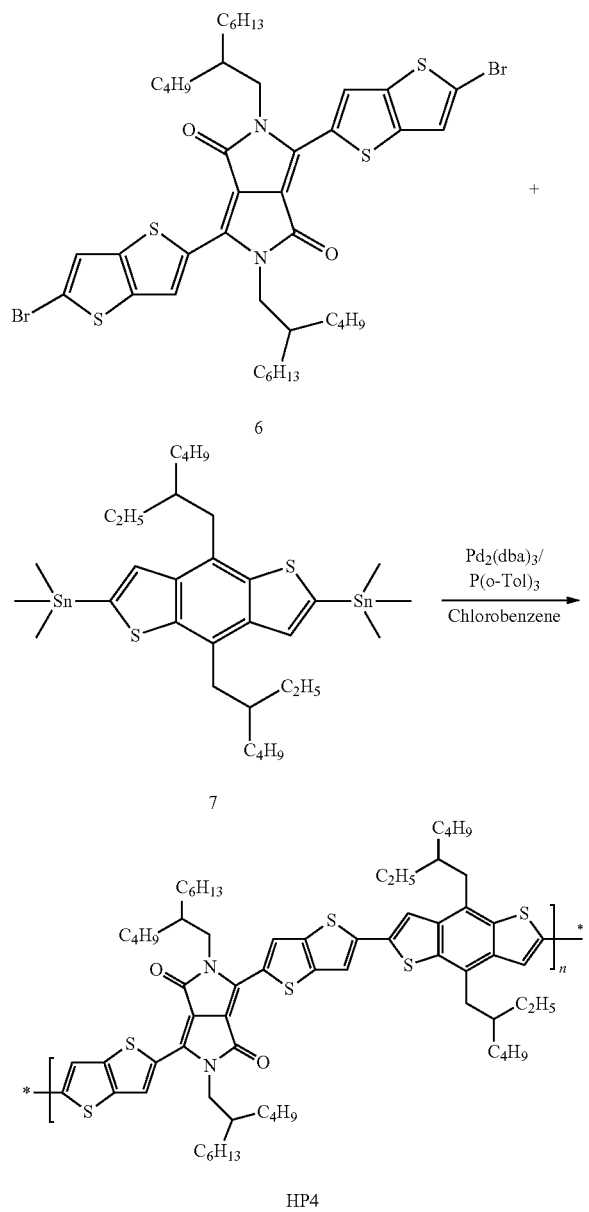

3,6-Bis-(5-bromo-thieno[3,2-b]thiophen-2-yl)-2,5-bis-(2-butyl-octyl)-2,5-dihydro-pyrrolo[3,4-c]pyrrole-1,4-dione 6 (50 mg, 0.055 mmol), 4,8-bis-(2-ethyl-hexyl)-2,6-bis-trimethylstannanyl-benzo[1,2-b:4,5-b]dithiophene 7 (40.8 mg, 0.055 mmol), $Pd_2(dba)_3$ (2.02 mg, 2.20 μmol), and $P(o\text{-Tol})_3$ (2.68 mg, 8.82 μmol) were combined in a 50 mL flask. The system was purged with argon before 10 mL of anhydrous chlorobenzene was added. The reaction mixture was heated at 130° C. for 18 hours. After cooling to room temperature, the polymer was precipitated out from methanol and further purified using Soxhlet extraction with methanol, hexane, THF and toluene. The product was extracted one more time with a Soxhlet setup with chloroform and weighed 12.9 mg (yield 20%) after drying in vacuo.

EXAMPLE 2B

Polymer Synthesis (HP9)

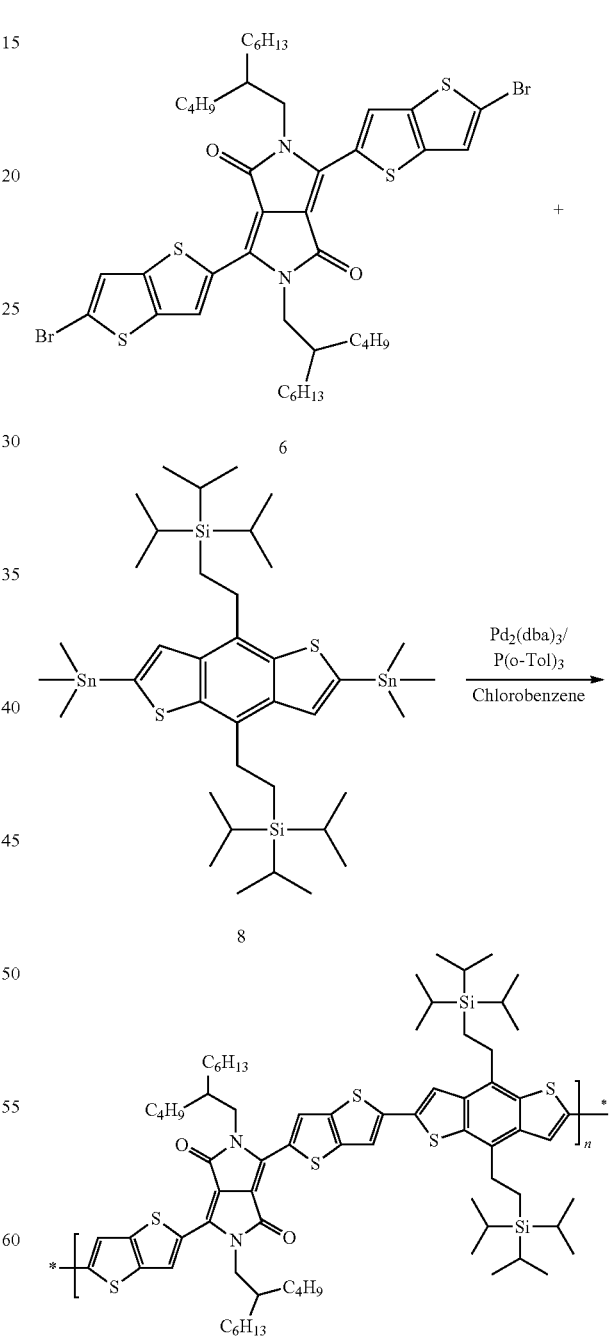

3,6-Bis-(5-bromo-thieno[3,2-b]thiophen-2-yl)-2,5-bis-(2-butyl-octyl)-2,5-dihydro-pyrrolo[3,4-c]pyrrole-1,4-dione 6 (45.3 mg, 0.05 mmol), 4,8-bis-(2-triisopropylsilanyl-ethyl)-2,6-bis-trimethylstannanyl-benzo[1,2-b:4,5-b]dithiophene 8 (44.3 mg, 0.05 mmol), $Pd_2(dba)_3$ (1.88 mg, 2.05 μmol), and $P(o-Tol)_3$ (2.43 mg, 7.98 mmol) were combined in a 50 mL flask. The system was purged with argon before 10 mL of anhydrous chlorobenzene was added. The reaction mixture was heated at 130° C. for 18 hours. After cooling to room temperature, the polymer was precipitated out from methanol and further purified by Soxhlet extraction with methanol, hexane, THF and toluene. The product was extracted one more time with a Soxhlet setup with chloroform and weighed 32.0 mg (yield 48.5%) after drying in vacuo.

EXAMPLE 3

Device Fabrication

Photovoltaic devices were fabricated and the characteristics of these devices were tested in air. The current-voltage (I-V) curves were obtained by a Keithley 2400 source-measure unit. The photocurrent was measured under simulated AM1.5G irradiation (100 mW $cm^{-2}$) using a xenon-lamp-based solar simulator (Newport 91160A 300 W Class-A Solar Simulator, 2 inch by 2 inch uniform beam) with air mass 1.5 global filter. The light intensity was set using a NREL calibrated silicon photodiode with a color filter.

Photovoltaic devices were fabricated incorporating HP9 and the bucky ball compound $C_{70}PCBM$. Before device fabrication, patterned ITO-coated glass substrates were cleaned by ultrasonic treatment in detergent, de-ionized water, acetone, isopropyl alcohol sequentially, and UV-ozone treatment for 15 minutes. A PEDOT:PSS layer of about 40 nm thickness was spin-coated from an aqueous solution onto ITO coated glass substrates, followed by baking at 150° C. for 30 minutes in the air. The polymer/PCBM mixture solution in chlorinated solvents (such as chloroform) was prepared at a concentration of 5:10 mg/ml. The solution was then stirred for ~2 hours at 40° C. in a glove box and was spin-coated on top of the PEDOT:PSS layer. The thickness of the active layer was about 100-300 nm. To complete the device fabrication, a thin layer of lithium fluoride (LiF) and 100 nm thickness of aluminum were successively deposited thermally under vacuum of ~$10^{-6}$ Torr. The active area of the device was about 0.088 $cm^2$. The devices were then encapsulated with a cover glass using a UV curable epoxy in the glove box. A power conversion efficiency ~4.09% was achieved. The device achieved high $V_{oc}$ and high FF at the same time ($V_{oc}$~0.72V and FF~50%).

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. An organic photovoltaic device comprising an anode, a cathode, and in between the anode and the cathode a semiconductor component, the semiconductor component comprising an oligomeric or polymeric compound comprising in its backbone a first repeat unit of the formula:

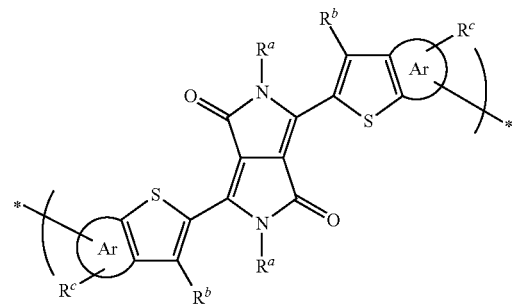

wherein:
each Ar independently is a monocyclic aryl or heteroaryl group;
$R^a$ is selected from H, a $C_{1-40}$ alkyl group, a $C_{2-40}$ alkenyl group, a $C_{2-40}$ alkynyl group, and a $C_{1-40}$ haloalkyl group, wherein:
each of the $C_{1-40}$ alkyl group, the $C_{2-40}$ alkenyl group, the $C_{2-40}$ alkynyl group, the $C_{1-40}$ haloalkyl group, optionally can be substituted with 1-10 substituents independently selected from a halogen, —CN, $NO_2$, OH, —$NH_2$, —NH($C_{1-20}$ alkyl), —N($C_{1-20}$ alkyl)$_2$, —S(O)$_2$OH, —CHO, —C(O)—$C_{1-20}$ alkyl, —C(O)OH, —C(O)—O$C_{1-20}$ alkyl, —C(O)$NH_2$, —C(O)NH—$C_{1-20}$ alkyl, —C(O)N($C_{1-20}$ alkyl)$_2$, —O$C_{1-20}$ alkyl, —$SiH_3$, —SiH($C_{1-20}$ alkyl)$_2$, —$SiH_2$($C_{1-20}$ alkyl), and —Si($C_{1-20}$ alkyl)$_3$; and
one or more non-adjacent —$CH_2$— groups in the $C_{1-40}$ alkyl group, the $C_{2-40}$ alkenyl group, the $C_{2-40}$ alkynyl group, and the $C_{1-40}$ haloalkyl group can be replaced by a group independently selected from —O—, —S—, —NH—, —N($C_{1-20}$ alkyl)-, —C(O)—, —C(O)O—, and —Si($C_{1-20}$ alkyl)$_2$—; and
each of $R^b$ and $R^c$ independently is selected from H and -L-R,
wherein:
L at each occurrence, independently is selected from O, S, and a covalent bond; and
R, at each occurrence, independently is a $C_{1-40}$ alkyl group;
wherein the oligomeric or polymeric compound comprises in its backbone a second repeat unit, the second repeat unit comprising (a) one or more optionally substituted polycyclic aryl or heteroaryl groups, (b) one or more optionally substituted monocyclic aryl or heteroaryl groups, and/or (c) one or more linear conjugated linkers.

2. The device of claim 1, wherein the moiety:

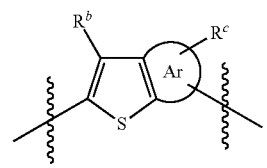

is selected from:

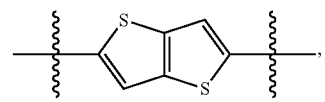

-continued

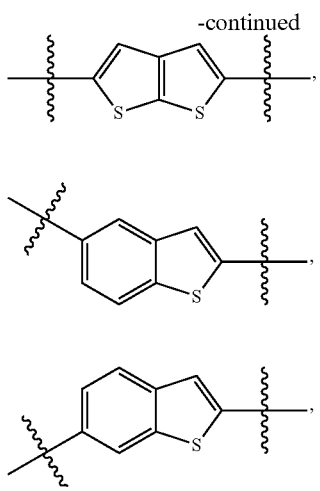

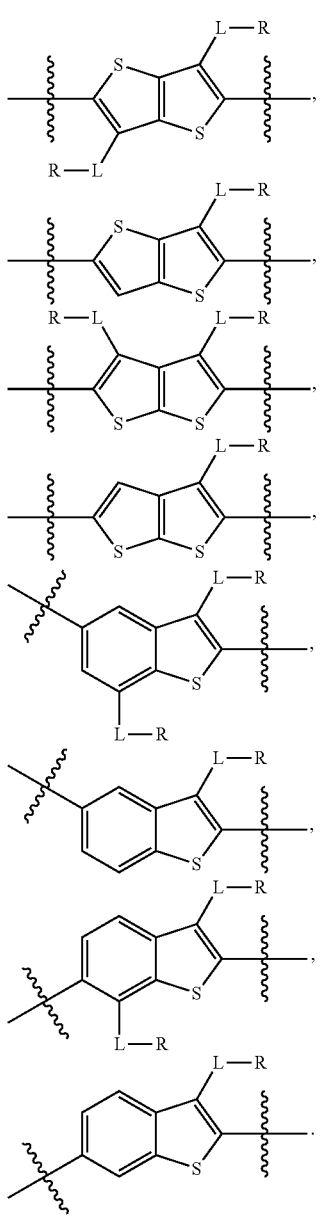

3. The device of claim 1, wherein the first repeat unit has the formula:

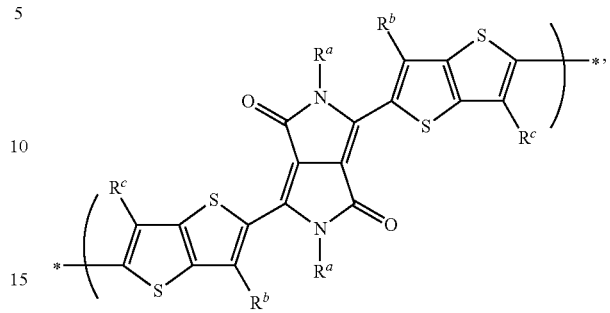

wherein $R^a$ is a $C_{6-40}$ alkyl group, and $R^b$ and $R^c$ independently are H or a $C_{6-40}$ alkyl group as defined in claim 1.

4. The device of claim 1, wherein $R^a$ is a $C_{6-40}$ alkyl group or a $C_{6-40}$ alkenyl group.

5. The device of claim 1, wherein $R^a$ is a branched $C_{6-40}$ alkyl group.

6. The device of claim 1, wherein the first repeat unit has the formula:

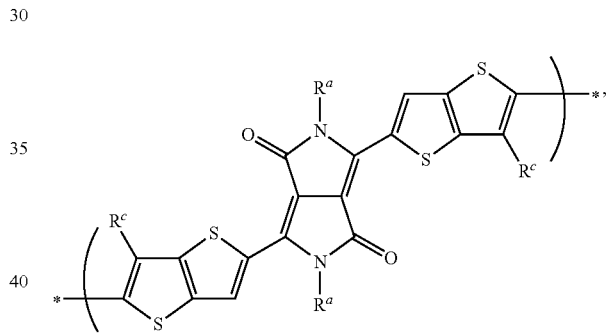

wherein $R^a$ is a $C_{6-40}$ alkyl group or a $C_{6-40}$ alkenyl group; and $R^c$ is H, a $C_{6-40}$ alkoxy group, or a $C_{6-40}$ alkylthio group.

7. The device of claim 1, wherein the second repeat unit has the formula:

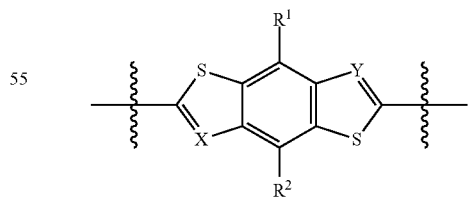

wherein:
  X is N or $CR^3$;
  Y is N or $CR^4$; and
  each of $R^1$, $R^2$, $R^3$, and $R^4$ independently is selected from H and -L-R, wherein L and R are as defined in claim 1.

8. The device of claim 1, wherein the oligomeric or polymeric compound has the formula:

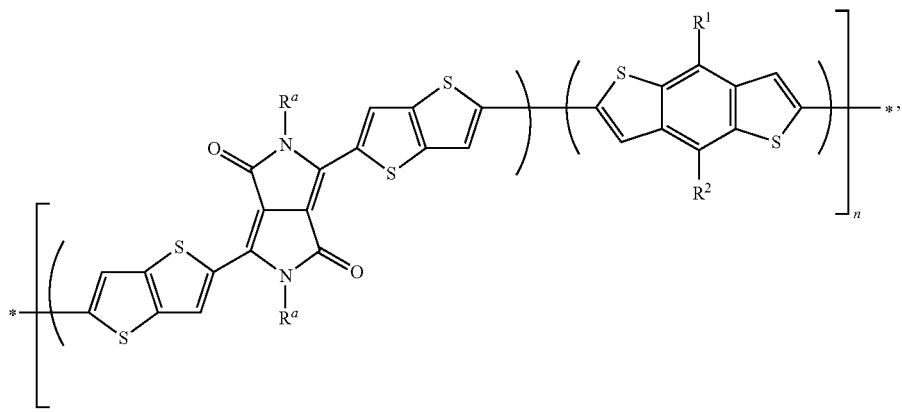

where each $R^a$ is a branched $C_{6-40}$ alkyl group; each of $R^1$ and $R^2$ is a branched $C_{6-40}$ alkyl or alkoxy group optionally substituted with a silyl group; and n is an integer that ranges from 10 to 10,000.

9. The device of claim 1, wherein the organic photovoltaic device is a bulk heterojunction photovoltaic device.

10. The device of claim 1, wherein the semiconductor component is photoactive and comprises a blend material.

11. The device of claim 10, wherein the blend material further comprises a fullerene compound in addition to the oligomeric or polymeric compound.

12. The device of claim 11, wherein the fullerene compound is [6,6]-phenyl-$C_{61}$-butyric acid methyl ester (PCBM).

* * * * *